(12) United States Patent
Bryant et al.

(10) Patent No.: US 8,759,916 B2
(45) Date of Patent: Jun. 24, 2014

(54) FIELD EFFECT TRANSISTOR AND A METHOD OF FORMING THE TRANSISTOR

(75) Inventors: Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/359,615

(22) Filed: Jan. 27, 2012

(65) Prior Publication Data
US 2013/0193481 A1 Aug. 1, 2013

(51) Int. Cl.
*H01L 29/78* (2006.01)

(52) U.S. Cl.
USPC .... 257/345; 257/344; 257/404; 257/E29.105; 438/303; 438/289; 438/291

(58) Field of Classification Search
USPC ......... 257/215, 288, 347, 368, 401, 328, 192; 438/149, 299–300
See application file for complete search history.

(56) References Cited

U.S. PATENT DOCUMENTS

| | | | |
|---|---|---|---|
| 5,272,365 A * | 12/1993 | Nakagawa | 257/194 |
| 5,726,459 A * | 3/1998 | Hsu et al. | 257/55 |
| 6,406,973 B1 | 6/2002 | Lee | |
| 6,458,662 B1 | 10/2002 | Yu | |
| 6,627,505 B2 * | 9/2003 | Adan | 438/311 |
| 6,716,690 B1 * | 4/2004 | Wang et al. | 438/197 |
| 6,767,793 B2 | 7/2004 | Clark et al. | |
| 6,921,933 B2 * | 7/2005 | Umimoto et al. | 257/288 |
| 7,205,586 B2 | 4/2007 | Takagi et al. | |
| 7,396,726 B2 | 7/2008 | Oh et al. | |
| 7,407,860 B2 | 8/2008 | Kim et al. | |
| 7,541,629 B1 | 6/2009 | Zhu et al. | |
| 7,776,698 B2 * | 8/2010 | Ye et al. | 438/285 |
| 7,964,910 B2 | 6/2011 | Dyer | |
| 2008/0023752 A1 | 1/2008 | Chen et al. | |
| 2009/0224263 A1 * | 9/2009 | Miyashita | 257/77 |

(Continued)

FOREIGN PATENT DOCUMENTS

JP 2008-078519 9/2006

OTHER PUBLICATIONS

"Recessed source/drain for sub-50 nm UTB SOI MOSFET." Semiconductor Science and Technology, 22 (2007) 577-583.*

(Continued)

*Primary Examiner* — Cheung Lee
*Assistant Examiner* — Stephen Bradley
(74) *Attorney, Agent, or Firm* — Gibb & Riley, LLC; Michael J. LeStrange, Esq.

(57) ABSTRACT

Disclosed are embodiments of a metal oxide semiconductor field effect transistor (MOSFET) structure and a method of forming the structure. The structure incorporates source/drain regions and a channel region between the source/drain regions. The source/drain regions can comprise silicon, which has high diffusivity to the source/drain dopant. The channel region can comprise a silicon alloy selected for optimal charge carrier mobility and band energy and for its low source/drain dopant diffusivity. During processing, the source/drain dopant can diffuse into the edge portions of the channel region. However, due to the low diffusivity of the silicon alloy to the source/drain dopant, the dopant does not diffuse deep into channel region. Thus, the edge portions of the silicon alloy channel region can have essentially the same dopant profile as the source/drain regions, but a different dopant profile than the center portion of the silicon alloy channel region.

23 Claims, 17 Drawing Sheets

(56) References Cited

U.S. PATENT DOCUMENTS

2010/0264470 A1* 10/2010 Thirupapuliyur et al. .... 257/288
2011/0068407 A1*  3/2011 Yeh et al. ...................... 257/369
2011/0227094 A1*  9/2011 Wahl et al. ...................... 257/77
2011/0266622 A1* 11/2011 Luning et al. ................. 257/347
2011/0267915 A1* 11/2011 Son et al. ................... 365/225.7

OTHER PUBLICATIONS

Yeo, et al., "Nanoscale Ultra-Thin-Body Silicon-on-Insulator P-MOSFET with a SiGe/Si Heterostructure Channel," IEEE Electron Device Letters, vol. 21, No. 4, Apr. 2000, pp. 161-163.

* cited by examiner

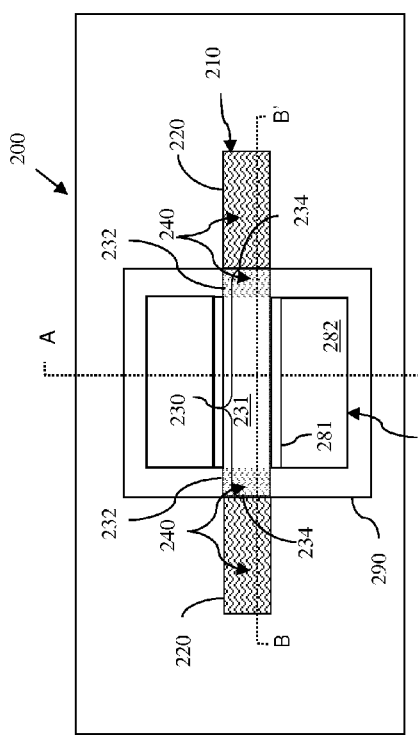
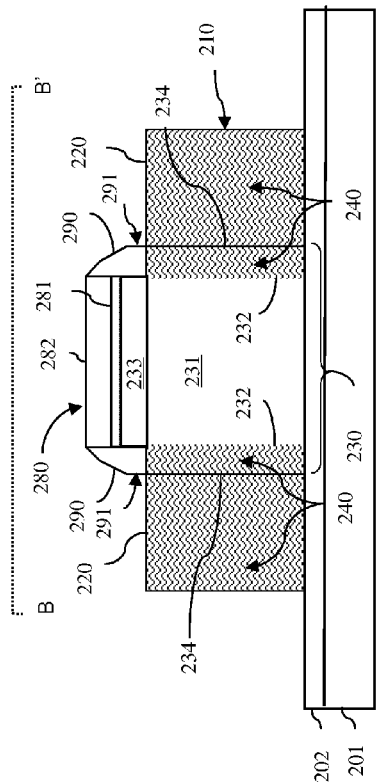
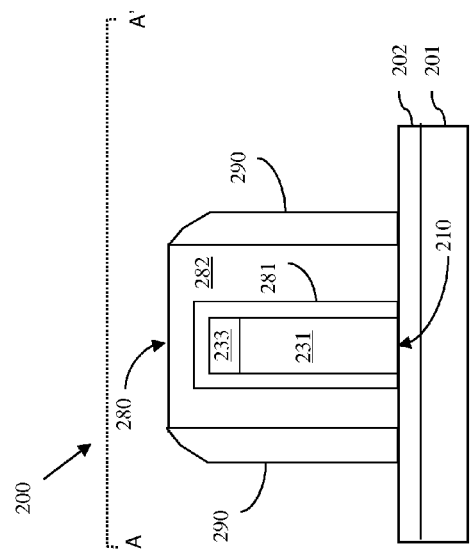
Figure 2A
Figure 2B
Figure 2C

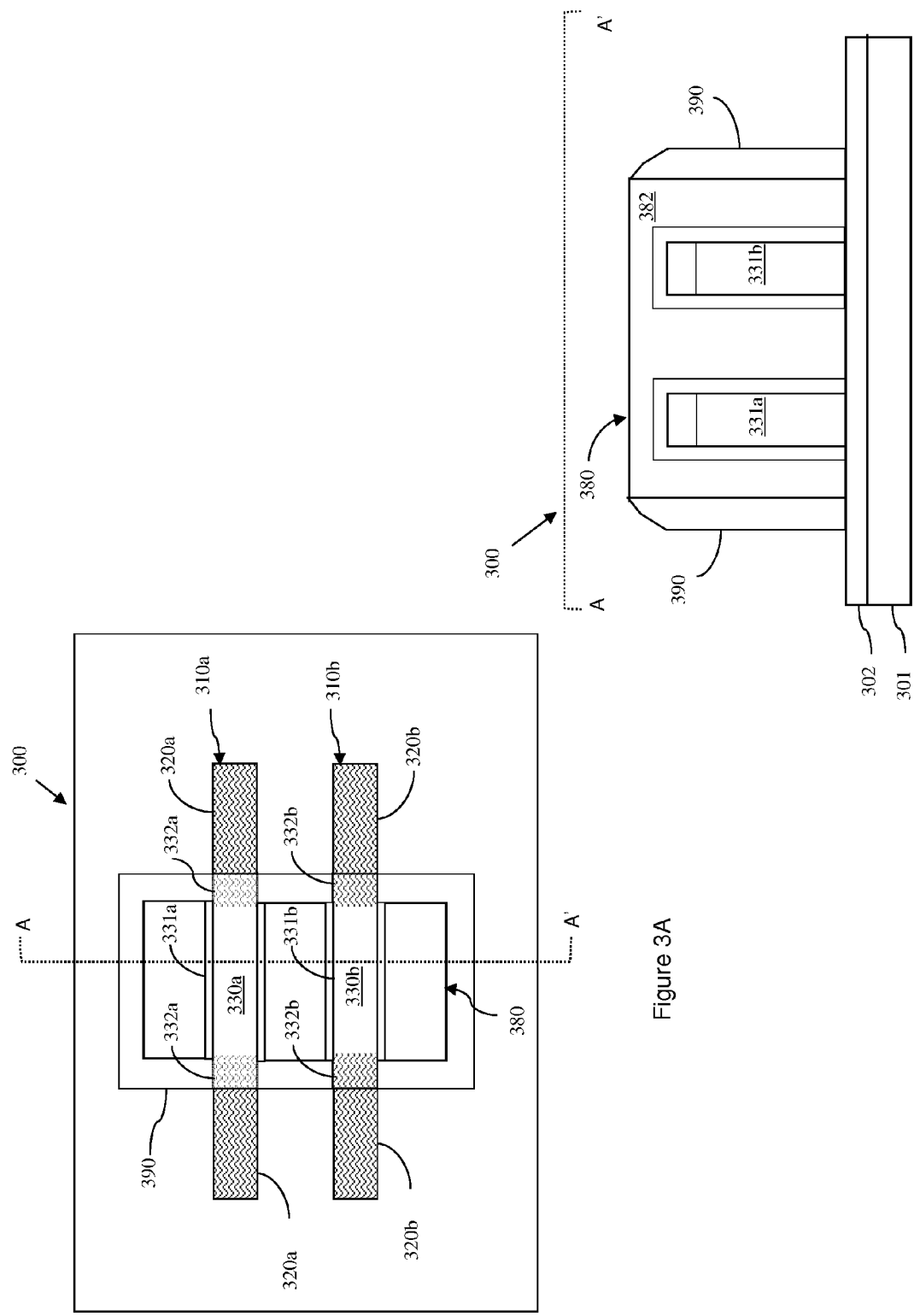

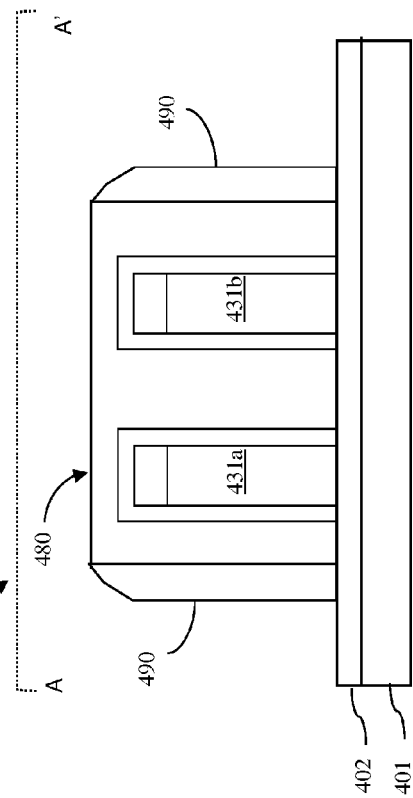
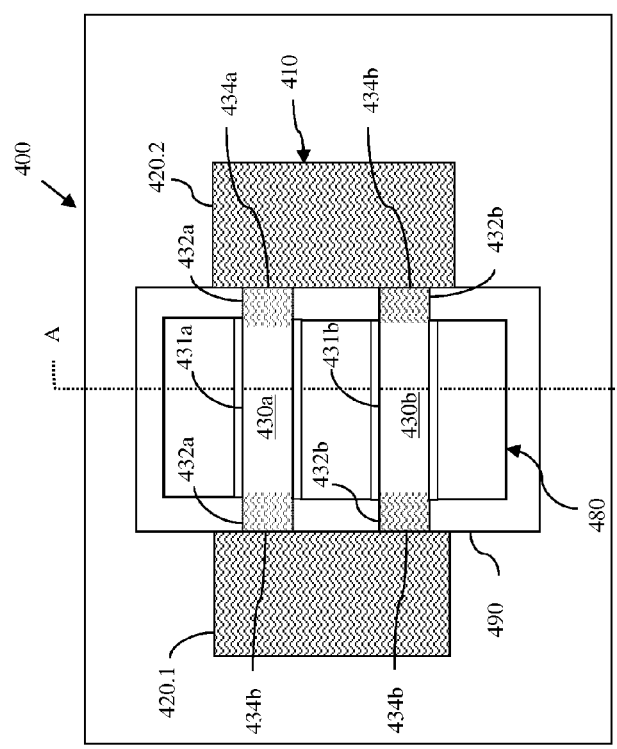
Figure 4B
Figure 4A

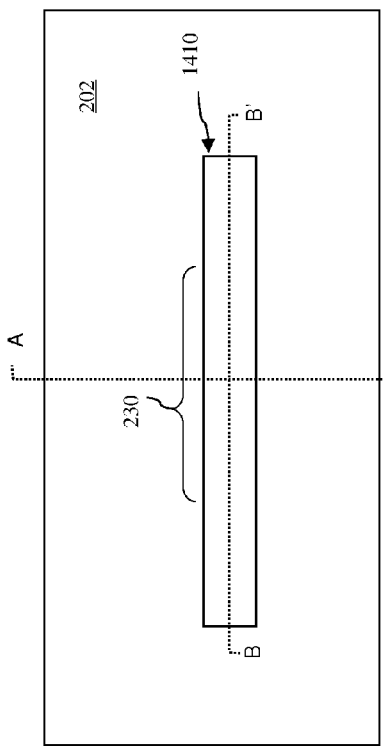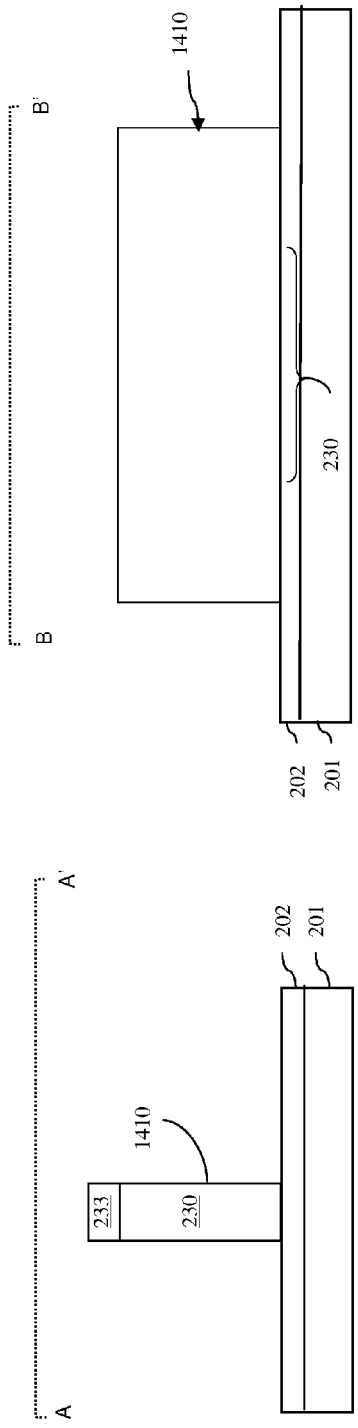

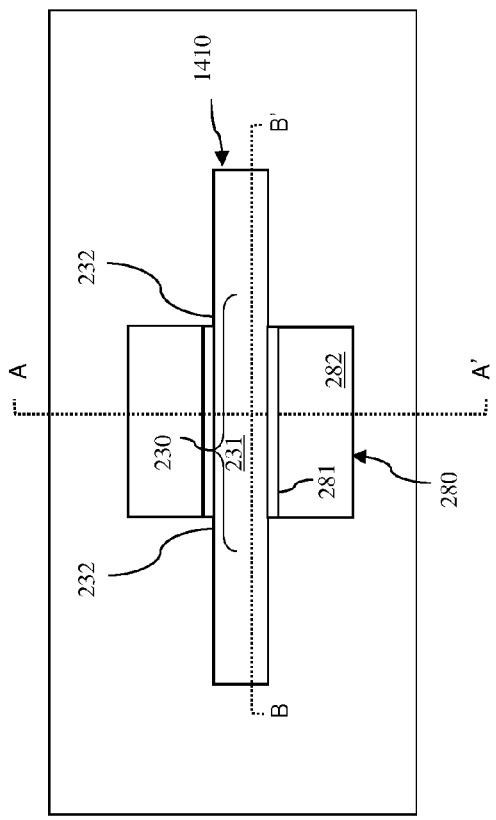
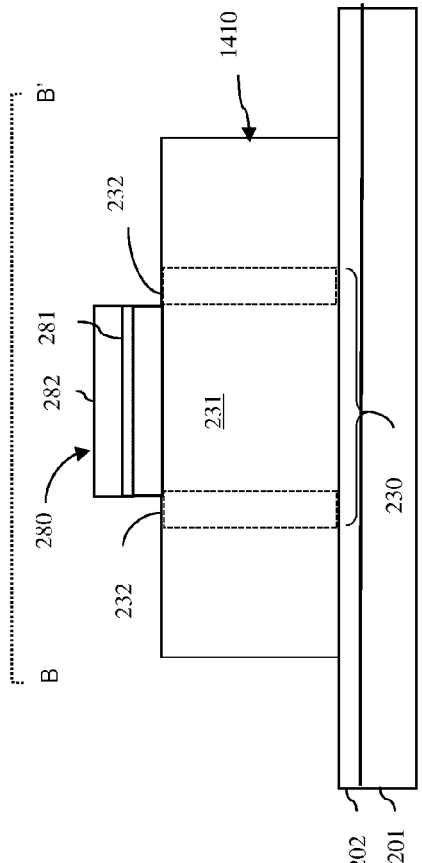
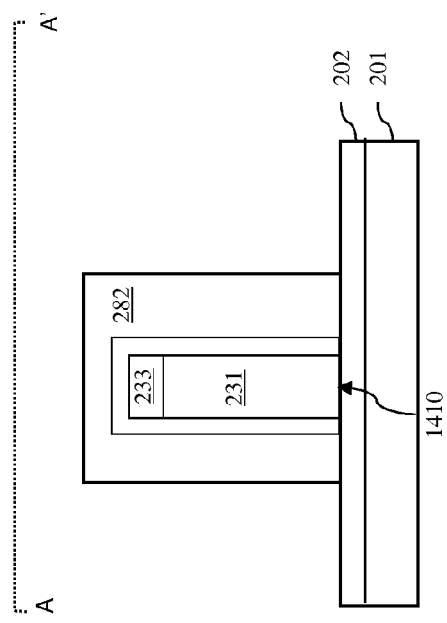
Figure 15A
Figure 15B
Figure 15C

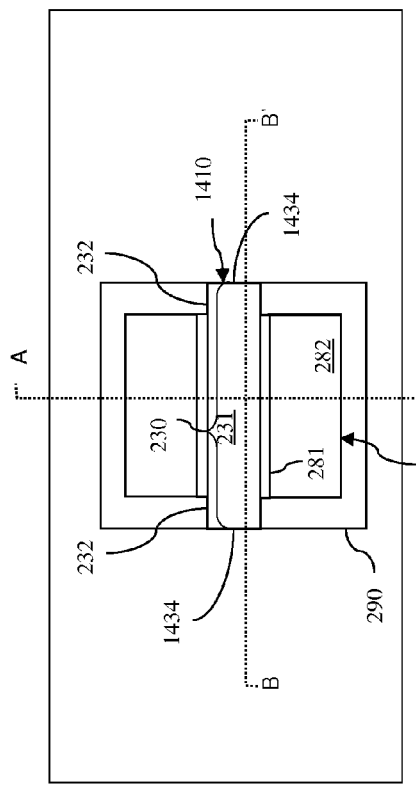
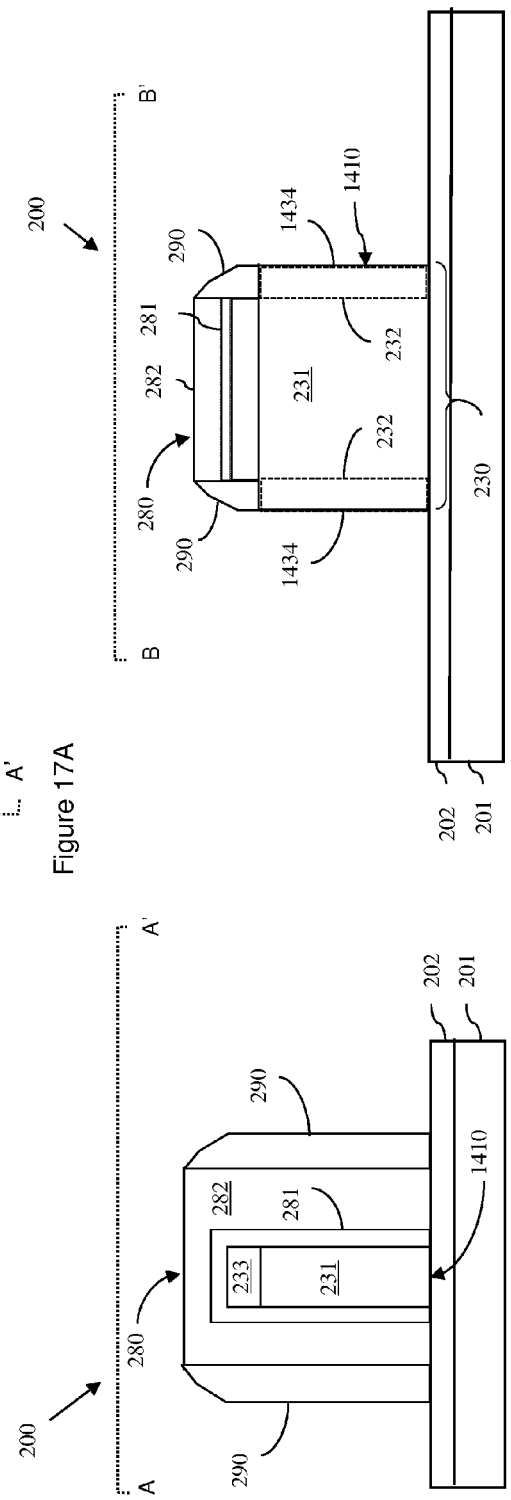

FIELD EFFECT TRANSISTOR AND A METHOD OF FORMING THE TRANSISTOR

BACKGROUND

1. Field of the Invention

The embodiments disclosed herein relate to field effect transistors and, more particularly, to a field effect transistor structure with silicon source/drain regions and, for optimal charge-carrier mobility and band energy, a silicon alloy channel region positioned laterally between the silicon source/drain regions.

2. Description of the Related Art

A hetero-structure P-type metal oxide semiconductor field effect transistor (MOSFET) typically incorporates a semiconductor body comprising a stack of silicon (Si) and silicon germanium (SiGe) layers. A gate structure is formed on a center portion of the stack and a P-type dopant (e.g., boron) is implanted into end portions of the stack so as to form the channel region and source/drain regions, respectively. The added silicon germanium in the channel region provides for greater hole mobility in the channel region and also allows the valence-band energy of the P-type MOSFET to be selectively adjusted (e.g., up to 300 millielectron volts (meV)) for device design optimization. Unfortunately, while the added silicon germanium can be beneficial, the diffusivity of boron through silicon germanium is quite low, thereby making an operable P-type MOSFET with an exclusively silicon germanium channel region heretofore unattainable. More specifically, prior attempts to make operable P-type MOSFETs with exclusively silicon germanium channel regions have failed because the low diffusivity of boron through silicon germanium introduces poor source/drain junction profiles, which in turn cause undesirable "short-channel effects", such as drain induced barrier lowering (DIBL) and a reduction in threshold voltage (Vt), also referred to as sub-threshold voltage swing.

SUMMARY

In view of the foregoing, disclosed herein are embodiments of a metal oxide semiconductor field effect transistor (MOSFET) structure (e.g., a planar MOSFET or a non-planar MOSFET, such as a single-fin or multi-fin, multi-gate MOSFET) and a method of forming the structure. The MOSFET structure incorporates source/drain regions and a channel region positioned laterally between the source/drain regions. The source/drain regions can be made up of silicon, which has high diffusivity to both P-type and N-type source/drain dopants. The channel region can be made up exclusively of a silicon alloy (e.g., silicon germanium or silicon germanium carbide for a P-type MOSFET or silicon carbide for an N-type MOSFET), which is selected for optimal charge carrier mobility and band energy and for having low source/drain dopant diffusivity. During processing, the source/drain dopant can diffuse into the edge portion of the silicon alloy channel region. However, due to the low diffusivity of the silicon alloy to the source/drain dopant, the dopant does not diffuse deep into channel region. Thus, the edge portions of the silicon alloy channel region can have essentially the same dopant profile as the silicon source/drain regions, but a different dopant profile than the center portion of the silicon alloy channel region. As a result, the source/drain junction profile of the MOSFET is enhanced and short-channel effects are lowered.

More particularly, disclosed herein are embodiments of a MOSFET structure. The MOSFET structure can comprise a semiconductor body. The semiconductor body can comprise silicon source/drain regions and a silicon alloy channel region positioned laterally between the silicon source/drain regions. The silicon alloy material used can be pre-selected for optimal charge carrier mobility and band energy and for having low source/drain dopant diffusivity, depending upon whether the MOSFET is a P-type MOSFET or N-type MOSFET. For example, if the MOSFET comprises a P-type MOSFET, the silicon alloy of the silicon alloy channel region can comprise, for example, silicon germanium or silicon germanium carbide. Alternatively, if the MOSFET comprises an N-type MOSFET, the silicon alloy of the silicon alloy channel region can comprise, for example, silicon carbide.

Additionally, for enhanced source/drain junction profiles and, thereby limited short-channel effects, edge portions of the silicon alloy channel region, which are adjacent to the silicon source/drain regions, and the center portion of the silicon alloy channel region, which is positioned laterally between the edge portions, can have different types of conductivity and/or different levels of conductivity. Specifically, the center portion of the silicon alloy channel region can have a different type conductivity than the edge portions of the silicon alloy channel region and the silicon source/drain regions. For example, if the MOSFET comprises a P-type MOSFET, the center portion of the silicon alloy channel region can have N-type conductivity and the edge portions of the silicon alloy channel region and the silicon source/drain regions can have P-type conductivity; whereas, if the MOSFET comprises an N-type MOSFET, the center portion of the silicon alloy channel region can have P-type conductivity and the edge portions of the silicon alloy channel region and the silicon source/drain regions can have N-type conductivity. Alternatively, the center portion of the silicon alloy channel region can have the same type conductivity as both the silicon source/drain regions and the edge portions of the silicon alloy channel region, but at a lesser conductivity level. For example, if the MOSFET comprises a P-type MOSFET, the center portion of the silicon alloy channel region can have a low level of P-type conductivity (i.e., P− conductivity) and the edge portions of the silicon alloy channel region and the silicon source/drain regions can have a high level of P-type conductivity (i.e., P+ conductivity); whereas, if the MOSFET comprises an N-type MOSFET, the center portion of the silicon alloy channel region can have a low level of N-type conductivity (i.e., N− conductivity) and the edge portions of the silicon alloy channel region and the silicon source/drain regions can have a high level of N-type conductivity (i.e., N+ conductivity).

It should further be noted that the MOSFET structure can comprise a planar MOSFET structure or a non-planar MOSFET structure (e.g., a single or multi-fin MOSFET structure).

Specifically, in one embodiment, a planar MOSFET structure can comprise a semiconductor body comprising a silicon alloy channel region positioned laterally between silicon source/drain regions, as described above. A trench isolation region can be positioned laterally adjacent to the semiconductor body. A gate structure can be positioned on the top surface of the semiconductor body over a center portion of the silicon alloy channel region. Gate sidewall spacers can be positioned on the top surface of the semiconductor body adjacent to the gate structure and over edge portions of the silicon alloy channel region.

In another embodiment, a non-planar MOSFET and, particularly, a single fin, dual-gate or tri-gate, MOSFET, can comprise a semiconductor body. The semiconductor body can comprise a semiconductor fin and the semiconductor fin can comprise a silicon alloy channel region positioned laterally between silicon source/drain regions, as described above.

A gate structure can be positioned on the top surface and opposing sidewalls of the semiconductor body over a center portion of the silicon alloy channel region. Gate sidewall spacers can be positioned on the top surface and opposing sidewalls of the semiconductor body adjacent to the gate structure and over edge portions of the silicon alloy channel region.

In yet another embodiment, a non-planar MOSFET structure and, particularly, a multi-fin, dual-gate or tri-gate, MOSFET structure can be configured in essentially the same manner as the single-fin, dual-gate or tri-gate MOSFET described above, but can incorporate multiple semiconductor bodies (i.e., multiple semiconductor fins). In this case, the gate structure and gate sidewall spacers can traverse the multiple semiconductor bodies at their respective silicon alloy channel regions.

In yet another embodiment, a non-planar MOSFET structure and, particularly, a multi-fin, dual-gate or tri-gate, MOSFET structure can comprise a semiconductor body comprising a single silicon source region, a single silicon drain region parallel to the single source region and a plurality of fin-shaped silicon alloy channel regions that extend from the source region to the drain region. In this case, the gate structure and gate sidewall spacers can traverse the multiple fin-shaped silicon alloy channel regions.

Also disclosed herein are method embodiments for forming the above-described MOSFETs.

An embodiment of a method of forming a planar MOSFET can comprise providing a silicon alloy layer. The silicon alloy material used can be pre-selected for optimal charge carrier mobility and band energy and for having low source/drain dopant diffusivity, depending upon whether the MOSFET is a P-type MOSFET or N-type MOSFET. For example, if the MOSFET comprises a P-type MOSFET, the silicon alloy can comprise, for example, silicon germanium or silicon germanium carbide. Alternatively, if the MOSFET comprises an N-type MOSFET, the silicon alloy can comprise, for example, silicon carbide.

A gate structure can be formed on the top surface of the silicon alloy layer over a center portion of the designated channel region. Next, gate sidewall spacers on the top surface of the silicon alloy layer positioned laterally adjacent to the gate structure and further positioned over edge portions of the channel region. After the gate structure and gate sidewall spacers are formed, recesses can be formed in the silicon alloy layer adjacent to the edge portions of the channel region and the recess can be filled (e.g., by epitaxial deposition) with silicon.

Next, the silicon in the recesses along with the edge portions of the channel region can be doped with a dopant to form silicon source/drain regions adjacent to the edge portions of the channel region, which as discussed above is made exclusively of the silicon alloy, and further to ensure that the edge portions of the channel region and the center portion of channel region have either different types of conductivity and/or different levels of conductivity in order to enhance the source/drain junction profiles and, thereby limit short-channel effects. Specifically, dopant implantation and anneal processes can be performed so that, after doping, the center portion of the silicon alloy channel region has a different conductivity type than the silicon source/drain regions and the edge portions of the silicon alloy channel region. For example, if the MOSFET comprises a P-type MOSFET, the center portion of the silicon alloy channel region can have N-type conductivity and the edge portions of the silicon alloy channel region and the silicon source/drain regions can be doped so as to have P-type conductivity; whereas, if the MOSFET comprises an N-type MOSFET, the center portion of the silicon alloy channel region can have P-type conductivity and the edge portions of the silicon alloy channel region and the silicon source/drain regions can be doped so as to have N-type conductivity. Alternatively, dopant implantation and anneal processes can be performed so that, after doping, the center portion of the silicon alloy channel region has the same type conductivity as both the silicon source/drain regions and the edge portions of the silicon alloy channel region, but at a lesser conductivity level. For example, if the MOSFET comprises a P-type MOSFET, the center portion of the silicon alloy channel region can have a low level of P-type conductivity (i.e., P− conductivity) and the edge portions of the silicon alloy channel region and the silicon source/drain regions can be doped so as to have a high level of P-type conductivity (i.e., P+ conductivity); whereas, if the MOSFET comprises an N-type MOSFET, the center portion of the silicon alloy channel region can have a low level of N-type conductivity (i.e., N− conductivity) and the edge portions of the silicon alloy channel region and the silicon source/drain regions can be doped so as to have a high level of N-type conductivity (i.e., N+ conductivity).

An embodiment of a method of forming a non-planar MOSFET can comprise forming a silicon alloy fin. The silicon alloy material used can be pre-selected for optimal charge carrier mobility and band energy and for having low source/drain dopant diffusivity, depending upon whether the MOSFET is a P-type MOSFET or N-type MOSFET. For example, if the MOSFET comprises a P-type MOSFET, the silicon alloy can comprise, for example, silicon germanium or silicon germanium carbide. Alternatively, if the MOSFET comprises an N-type MOSFET, the silicon alloy can comprise, for example, silicon carbide.

A gate structure can be formed on the opposing sides and the top surface of the silicon alloy fin positioned over a center portion of the designated channel region. Next, gate sidewall spacers on the opposing sides and top surface of the silicon alloy fin positioned laterally adjacent to the gate structure and further positioned over edge portions of the channel region. After the gate structure and gate sidewall spacers are formed, outer sections of the silicon alloy fin can be removed such that side surfaces of the edge portions of the channel region are exposed.

Then, silicon can be deposited (e.g., by lateral epitaxial deposition) on the exposed side surfaces.

Next, the silicon along with the edge portions of the channel region can be doped with a dopant to form silicon source/drain regions adjacent to the edge portions of the channel region, which as discussed above is made exclusively of the silicon alloy, and further to ensure that the edge portions of the channel region and the center portion of channel region have either different types of conductivity and/or different levels of conductivity in order to enhance the source/drain junction profiles and, thereby limit short-channel effects. Specifically, dopant implantation and anneal processes can be performed so that, after doping, the center portion of the silicon alloy channel region has a different conductivity type than the silicon source/drain regions and the edge portions of the silicon alloy channel region. For example, if the MOSFET comprises a P-type MOSFET, the center portion of the silicon alloy channel region can have N-type conductivity and the edge portions of the silicon alloy channel region and the silicon source/drain regions can be doped so as to have P-type conductivity; whereas, if the MOSFET comprises an N-type MOSFET, the center portion of the silicon alloy channel region can have P-type conductivity and the edge portions of the silicon alloy channel region and the silicon source/drain regions can be doped so as to have N-type conductivity. Alternatively, dopant implantation and anneal processes can be performed so that, after doping, the center portion of the silicon alloy channel region has the same type conductivity as both the silicon source/drain regions and the edge portions of the silicon alloy channel region, but at a lesser conductivity level. For example, if the MOSFET comprises a P-type MOSFET, the center portion of the silicon alloy channel region can have a low level of P-type conductivity (i.e., P− conductivity) and the edge portions of the silicon alloy channel region and the silicon source/drain regions can be doped so as to have a high level of P-type conductivity (i.e., P+ conductivity); whereas, if the MOSFET comprises an N-type MOSFET, the center portion of the silicon alloy channel region can have a low level of N-type conductivity (i.e., N− conductivity) and the edge portions of the silicon alloy channel region and the silicon source/drain regions can be doped so as to have a high level of N-type conductivity (i.e., N+ conductivity).

Embodiments of a method of forming a multi-fin non-planar MOSFET structure can proceed using essentially the same techniques described above for forming a single-fin MOSFET. In this case, multiple silicon alloy fins can be formed. Then, the gate structure and gate sidewall spacers can be formed so as to traverse all of the channel regions of all of the silicon alloy fins. Next, all outer sections of all of the silicon alloy fins can be removed and silicon can be deposited (e.g., by lateral epitaxial deposition) on all exposed side surfaces of all edge portions of all of the channel regions. It should be noted that the deposition process can be performed so that the silicon on adjacent fins remains separated and, thereby such that each channel region is positioned laterally between discrete corresponding source/drain regions. Alternatively, the deposition process can be performed so that the silicon on adjacent fins merges to form a single source region and a single drain region with the channel regions extending from the single source region to the single drain region. Doping can then proceed in the manner described above.

BRIEF DESCRIPTION OF THE DRAWINGS

The embodiments herein will be better understood from the following detailed description with reference to the drawings, which are not necessarily drawn to scale and in which:

FIG. 2A is a horizontal cross-section illustration of an embodiment of a non-planar field effect transistor;

FIG. 2B is a vertical cross-section illustration of the field effect transistor of FIG. 2A along its width through plane A-A';

FIG. 2C is a vertical cross-section illustration of the field effect transistor of FIG. 2A along its length through plane B-B';

FIG. 3A is a horizontal cross-section illustration of another embodiment of a non-planar field effect transistor;

FIG. 3B is a vertical cross-section illustration of the field effect transistor of FIG. 3A along its width through plane A-A';

FIG. 4A is a horizontal cross-section illustration of yet another embodiment of a non-planar field effect transistor;

FIG. 4B is a vertical cross-section illustration of the field effect transistor of FIG. 4A along its width through plane A-A';

FIG. 14A is a horizontal cross-section illustration of a partially completed single-fin non-planar field effect transistor formed according to the method of FIG. 12;

FIG. 14B is a vertical cross-section illustration of the partially completed single-fin non-planar field effect transistor of FIG. 14A along its width through plane A-A';

FIG. 14C is a vertical cross-section illustration of the partially completed single-fin non-planar field effect transistor of FIG. 14A along its length through plane B-B';

FIG. 15A is a horizontal cross-section illustration of a partially completed single-fin non-planar field effect transistor formed according to the method of FIG. 12;

FIG. 15B is a vertical cross-section illustration of the partially completed single-fin non-planar field effect transistor of FIG. 15A along its width through plane A-A';

FIG. 15C is a vertical cross-section illustration of the partially completed single-fin non-planar field effect transistor of FIG. 15A along its length through plane B-B';

FIG. 17A is a horizontal cross-section illustration of a partially completed single-fin non-planar field effect transistor formed according to the method of FIG. 12;

FIG. 17B is a vertical cross-section illustration of the partially completed single-fin non-planar field effect transistor of FIG. 17A along its width through plane A-A';

FIG. 17C is a vertical cross-section illustration of the partially completed single-fin non-planar field effect transistor of FIG. 17A along its length through plane B-B';

DETAILED DESCRIPTION

Figure 1:
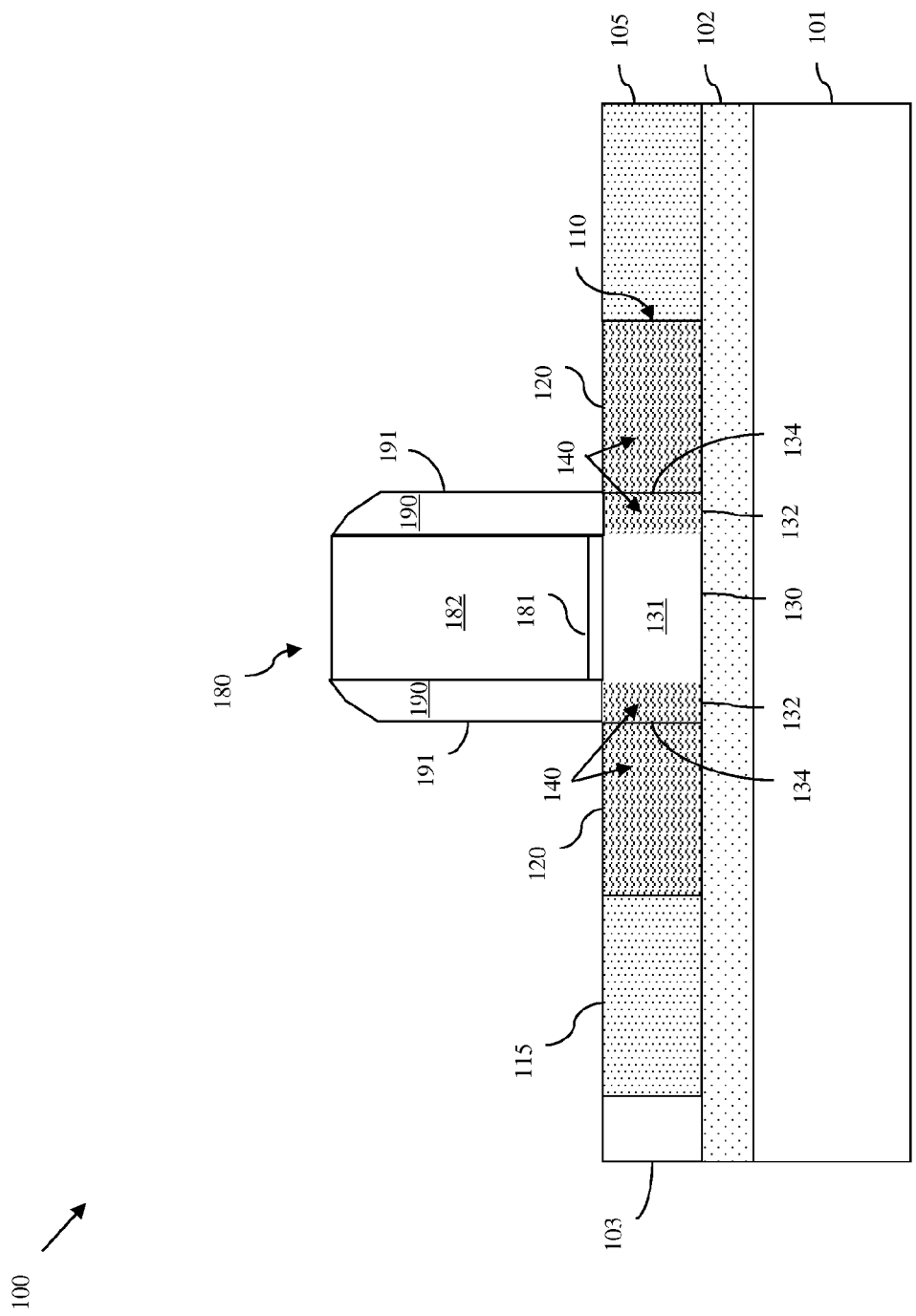
FIG. 1 is a cross-section illustration of an embodiment of a planar field effect transistor.

As mentioned above, a hetero-structure P-type metal oxide semiconductor field effect transistor (MOSFET) typically incorporates a semiconductor body comprising a stack of silicon (Si) and silicon germanium (SiGe) layers. A gate structure is formed on a center portion of the stack and a P-type dopant (e.g., boron) is implanted into end portions of the stack so as to form the channel region and source/drain regions, respectively. The added silicon germanium in the channel region provides for greater hole mobility in the channel region and also allows the valence-band energy of the P-type MOSFET to be selectively adjusted (e.g., up to 300 millielectron volts (meV)) for device design optimization. Unfortunately, while the added silicon germanium can be beneficial, the diffusivity of boron through silicon germanium is quite low, thereby making an operable P-type MOSFET with an exclusively silicon germanium channel region heretofore unattainable. More specifically, prior attempts to make operable P-type MOSFETs with exclusively silicon germanium channel regions have failed because the low diffusivity of boron through silicon germanium introduces poor source/drain junction profiles, which in turn cause undesirable "short-channel effects", such as drain induced barrier lowering (DIBL) and a reduction in threshold voltage (Vt), also referred to as sub-threshold voltage swing.

In view of the foregoing, disclosed herein are embodiments of a metal oxide semiconductor field effect transistor (MOSFET) structure (e.g., a planar MOSFET or a non-planar MOSFET, such as a single-fin or multi-fin, multi-gate MOSFET) and a method of forming the structure. The MOSFET structure incorporates source/drain regions and a channel region positioned laterally between the source/drain regions. The source/drain regions can be made up of silicon, which has high diffusivity to both P-type and N-type source/drain dopants. The channel region can be made up exclusively of a silicon alloy (e.g., silicon germanium or silicon germanium carbide for a P-type MOSFET or silicon carbide for an N-type MOSFET), which is selected for optimal charge carrier mobility and band energy and for having low source/drain dopant diffusivity. During processing, the source/drain dopant can diffuse into the edge portion of the silicon alloy channel region. However, due to the low diffusivity of the silicon alloy to the source/drain dopant, the dopant does not diffuse deep into channel region. Thus, the edge portions of the silicon alloy channel region can have essentially the same dopant profile as the silicon source/drain regions, but a different dopant profile than the center portion of the silicon alloy channel region. As a result, the source/drain junction profile of the MOSFET is enhanced and short-channel effects are lowered.

More particularly, disclosed herein are various embodiments of a MOSFET structure. This MOSFET structure can comprise a planar MOSFET structure 100 (see FIG. 1). Alternatively, this MOSFET structure can comprise a non-planar MOSFET structure (see the single-fin, dual-gate or tri-gate, MOSFET structure 200 of FIGS. 2A-2C, the multi-fin, dual-gate or tri-gate, MOSFET structure 300 of FIGS. 3A-3B or the multi-fin, dual-gate or tri-gate MOSFET structure 400 of FIGS. 4A-4B).

The MOSFET structure 100, 200, 300 and 400 can comprise a semiconductor-on-insulator MOSFET structure. Specifically, the MOSFET structure 100, 200, 300, 400 can comprise a substrate 101, 201, 301, 401 (e.g., a silicon substrate or any other suitable substrate); an insulator layer 102, 202, 302, 402 (e.g., a silicon dioxide (SiO2) layer, a sapphire layer or any other suitable insulator layer) on the substrate 101, 201, 301, 401; and at least one semiconductor body 110, 210, 310a-b and 410 on the insulator layer 102, 202, 302, 402. Alternatively, the MOSFET structure can comprise a bulk semiconductor structure (not shown).

FIG. 1 is a cross-section illustration of a planar MOSFET structure 100 through a vertical plane extending the length of the device. Referring to FIG. 1, this planar MOSFET 100 can comprise a semiconductor body 110 within a silicon alloy layer 103 on the insulator layer 102. The size and the essentially rectangular shape of the semiconductor body 110 can be defined by an isolation region 105 that extends vertically through the silicon alloy layer 103 to the insulator layer 102 and laterally surrounds the semiconductor body 110. This isolation region 105 can comprise, for example, a conventional shallow trench isolation (STI) region in the silicon alloy layer 103. That is, it can comprise a relatively shallow trench, which is extends vertically through the silicon alloy layer 103 to the insulator layer 102 and which is filled with one or more isolation materials (e.g., silicon oxide, silicon nitride, silicon oxynitride, etc.).

The semiconductor body 110 can comprise silicon source/drain regions 120 and an exclusively silicon alloy channel region 130 positioned laterally between the silicon source/drain regions 120. For purposes of this disclosure, the phrase an "exclusively silicon alloy channel region" refers to the fact that the channel region is formed from a silicon alloy alone and not from a combination of silicon and silicon alloy layers, as in prior art hetero-structures. The silicon alloy layer 103 can be relatively thin (e.g., between 5 and 500 nm and, preferably, between 10 and 100 nm) such that the silicon alloy channel region 130 is relatively thin. The silicon source/drain regions 120 can, for example, comprise epitaxial silicon-filled recesses in the silicon alloy layer 103 between the STI region 105 and the silicon alloy channel region 130. That is, as discussed in detail below with regard to the method embodiments, recesses can be formed adjacent to the silicon alloy channel region 130. These recesses can subsequently be filled with epitaxial silicon and appropriately doped to form the silicon source/drain regions 120 in the semiconductor body 110 adjacent to the silicon alloy channel region 130. It should be noted that, while the recesses and, thereby the silicon source/drain regions 120, are illustrated in FIG. 1 as being essentially rectangular in shape with vertical sidewalls such that the interfaces 134 between the silicon source/drain regions 120 and the silicon alloy channel region 130 are essentially vertical, it is anticipated that the recesses may alternatively have one or more angled sidewalls (i.e., sidewalls that are not perpendicular to the top surface of the insulator layer 102). For example, as illustrated in U.S. Pat. No. 7,964,910 of Dyer, issued on Jun. 21, 2011, assigned to International Business Machines, Inc. and incorporated herein by reference, source/drain recesses in a planar MOSFET can have angled sidewalls for optimal epitaxial deposition. Additionally, it should be noted that, while the top surfaces of the silicon source/drain regions 120 and the silicon alloy channel region 130 are illustrated as being coplanar, it is anticipated that, due to the epitaxial process used to fill the recesses, these top surfaces can be non-coplanar.

A gate structure 180 can be positioned on the top surface of the semiconductor body 110 such that it is over and immediately adjacent to a center portion 131 of the silicon alloy channel region 130. Specifically, the gate structure 180 can comprise a gate dielectric layer 181 (e.g., a gate oxide layer, a high-k gate dielectric layer or other suitable gate dielectric layer) on the center portion 131 of the silicon alloy channel region 130 and a gate conductor layer 182 (e.g., a polysilicon gate conductor layer, a metal gate conductor layer, a dual work function gate conductor layer or other suitable gate conductor layer) on the gate dielectric layer 181. Additionally, dielectric gate sidewall spacers 190 (e.g., silicon nitride spacers, silicon oxide spacers, silicon oxynitride spacers or any other suitable single or multi-layered dielectric gate sidewall spacers) can be positioned on opposing sidewalls of the gate structure 180 and on the top surface of the semiconductor body 110 such that they are over and immediately adjacent to edge portions 132 of the silicon alloy channel region 130. Due to the processing techniques used to form the recesses for the silicon source/drain regions 120, as discussed in greater detail below with regard to the method embodiments, the outer surfaces 191 of the gate sidewall spacers 190 can be aligned above the interfaces 134 between the silicon source/drain regions 120 and the edge portions 132 of the silicon alloy channel region 130.

The silicon alloy material used in the silicon alloy channel region 130 can be pre-selected for optimal charge carrier mobility and band energy and for having low source/drain dopant diffusivity, depending upon whether the MOSFET is a P-type MOSFET or N-type MOSFET. For example, if the MOSFET 100 comprises a P-type MOSFET, then the silicon alloy of the silicon alloy channel region 130 can comprise, for example, silicon germanium or silicon germanium carbide, which have low diffusivity for P-type dopants and can provide for optimal hole mobility and valence band energy. Contrarily, if the MOSFET 100 comprises an N-type MOSFET, then the silicon alloy of the silicon alloy channel region 130 can comprise silicon carbide, which has low diffusivity for N-type dopants and can provide for optimal electron mobility and conduction band energy.

Furthermore, for enhanced source/drain junction profiles and, thereby limited short-channel effects, the edge portions 132 of the silicon alloy channel region 130 below the gate sidewall spacers 190 and the center portion 131 of the silicon alloy channel region 130 below the gate structure 180 can have different types of conductivity and/or different levels of conductivity. That is, the silicon source/drain regions 120 and the edge portions 132 of the silicon alloy channel region 130 can be doped with the same dopant 140 such that the center portion 131 of the silicon alloy channel region 130 either has a different type conductivity than the edge portions 132 of the silicon alloy channel region 130 and the silicon source/drain regions 120 or has the same type conductivity as both the silicon source/drain regions 120 and the edge portions 132 of the silicon alloy channel region 130, but at a lesser conductivity level.

For example, if the MOSFET 100 comprises a P-type MOSFET, then the silicon source/drain regions 120 and the edge portions 132 of the silicon alloy channel region 130 can each have P-type conductivity. That is, the silicon source/drain regions 120 and edge portions 132 of the silicon alloy channel region 130 can each be doped with a relatively high concentration of a P-type dopant so as to have P+ conductivity. In this case, the center portion 131 of the silicon alloy channel region 130 either can have N-type conductivity (i.e., the center portion 131 of the silicon alloy channel region 130 can be doped with an N-type dopant) or can have P-type conductivity at a lesser conductivity level (i.e., the center portion 131 of the silicon alloy channel region 130 can be doped with a relatively low concentration of a P-type dopant so as to have P− conductivity). However, if the MOSFET 100 comprises an N-type MOSFET, then the silicon source/drain regions 120 and the edge portions 132 of the silicon alloy channel region 130 can each have N-type conductivity. Specifically, the silicon source/drain regions 120 and edge portions 132 of the silicon alloy channel region 130 can each be doped with a relatively high concentration of an N-type dopant so as to have N+ conductivity. In this case, the center portion 131 of the silicon alloy channel region 130 either can have P-type conductivity (i.e., the center portion 131 of the silicon alloy channel region 130 can be doped with a P-type dopant) or can have N-type conductivity at a lesser conductivity level (i.e., the center portion 131 of the silicon alloy channel region 130 can be doped with a relatively low concentration of an N-type dopant so as to have N− conductivity).

FIG. 2A is cross-section illustration of a non-planar, multi-gate MOSFET structure 200 and, particularly, a single fin, multi-gate MOSFET through a horizontal plane. This single fin, multi-gate MOSFET can comprise, for example, a dual-gate MOSFET, also referred to as a FINFET, or a tri-gate MOSFET. FIG. 2B is a cross-section illustration of the same MOSFET structure 200 through a vertical plane A-A', as shown in FIG. 2A and FIG. 2C is another cross-section illustration of the same MOSFET structure 200 through a vertical plane B-B', as shown in FIG. 2A.

Referring to FIGS. 2A-2C in combination, this non-planar multi-gate MOSFET 200 can comprise a single semiconductor body 210 and, particularly, a single semiconductor fin on the insulator layer 202. The semiconductor body 210 can comprise silicon source/drain regions 220 and an exclusively silicon alloy channel region 230 positioned laterally between the silicon source/drain regions 220. For purposes of this disclosure, the phrase an "exclusively silicon alloy channel region" refers to the fact that the channel region 230 is formed from a silicon alloy alone and not from a combination of silicon and silicon alloy layers, as in prior art hetero-structures. The width of the semiconductor body 210 (i.e., the semiconductor fin), particularly, at the channel region 230 may be between 5 and 100 nms. Those skilled in the art will recognize that the aspect ratio (i.e., the height to width ratio) of the semiconductor body 210 and, particularly, the aspect ratio of the silicon alloy channel region 230 may vary depending upon whether the MOSFET 200 is a dual-gate MOSFET or a tri-gate MOSFET. For example, the aspect ratio of a channel region in a dual-gate MOSFET can be 1:4 or greater because only two dimensional field effects are relied on to achieve channel region depletion; whereas the aspect ratio of the channel region in a tri-gate MOSFET can range between 3:2 and 2:3 because three dimensional field effects are relied on to achieve channel region depletion.

The silicon source/drain regions 220 can, for example, comprise epitaxial silicon regions laterally deposited, during processing as discussed in detail below with regards to the method embodiments, onto exposed surfaces of the silicon alloy channel region 230 at interfaces 234. It should be noted that, while the interfaces 234 between the epitaxial silicon source/drain regions 220 and the silicon alloy channel region 230 are illustrated as being essentially vertical, it is anticipated that the interfaces 234 may alternatively be angled (i.e., not perpendicular to the top surface of the insulator layer 202).

A gate structure 280 can be positioned on the top surface and opposing sidewalls of the semiconductor body 210 such that it is adjacent to a center portion 131 of the silicon alloy channel region 230. Specifically, the gate structure 280 can comprise a gate dielectric layer 281 (e.g., a gate oxide layer, a high-k gate dielectric layer or other suitable gate dielectric layer) on top surface and opposing sidewalls of the semiconductor body 210 adjacent to the center portion 231 of the silicon alloy channel region 230 and a gate conductor layer 282 (e.g., a polysilicon gate conductor layer, a metal gate conductor layer, a dual work function gate conductor layer or other suitable gate conductor layer) on the gate dielectric layer 281. It should be noted that in the case of a dual-gate MOSFET 200, the gate structure 280 can be electrically isolated from the top surface of the silicon alloy channel region 230 by a dielectric cap layer 233 (e.g., a silicon nitride cap layer, a silicon oxide cap layer, a silicon oxynitride cap layer or any other suitable dielectric cap layer). Additionally, dielectric gate sidewall spacers 290 (e.g., silicon nitride spacers, silicon oxide spacers, silicon oxynitride spacers or any other suitable single or multi-layered dielectric gate sidewall spacers) can be positioned on the gate structure 280 such that they are on the top surface and opposing sidewalls of the semiconductor body 210 adjacent to edge portions 232 of the silicon alloy channel region 230. It should be noted that, due to the processing techniques used to form epitaxial silicon source/drain regions 220, as discussed in greater detail below with regard to the method embodiments, the outer surfaces 291 of the gate sidewall spacers 290 can be aligned above the interfaces 234 between the silicon source/drain regions 220 and the edge portions 232 of the silicon alloy channel region 230 (see FIG. 2C).

The silicon alloy material used for the silicon alloy channel region 230 can be pre-selected for optimal charge carrier mobility and band energy and for having low source/drain dopant diffusivity, depending upon whether the MOSFET is a P-type MOSFET or N-type MOSFET. For example, if the MOSFET 200 comprises a P-type MOSFET, then the silicon alloy of the silicon alloy channel region 230 can comprise, for example, silicon germanium or silicon germanium carbide, which have low diffusivity for P-type dopants and which provide for optimal hole mobility and valence band energy. Contrarily, if the MOSFET 200 comprises an N-type MOSFET, then the silicon alloy of the silicon alloy channel region 230 can comprise silicon carbide, which has low diffusivity for N-type dopants and which provides for optimal electron mobility and conduction band energy.

Furthermore, for enhanced source/drain junction profiles and, thereby limited short-channel effects, the edge portions 232 of the silicon alloy channel region 230 below the gate sidewall spacers 290 and the center portion 231 of the silicon alloy channel region 230 below the gate structure 280 can have different types of conductivity and/or different levels of conductivity. That is, the silicon source/drain regions 220 and the edge portions 232 of the silicon alloy channel region 230 can be doped with the same dopant 240 such that the center portion 231 of the silicon alloy channel region 230 either has a different type conductivity than the edge portions 232 of the silicon alloy channel region 230 and the silicon source/drain regions 220 or has the same type conductivity as both the silicon source/drain regions 220 and the edge portions 232 of the silicon alloy channel region 230, but at a lesser conductivity level.

For example, if the MOSFET 200 comprises a P-type MOSFET, then the silicon source/drain regions 220 and the edge portions 232 of the silicon alloy channel region 230 can each have P-type conductivity. That is, the silicon source/drain regions 220 and edge portions 232 of the silicon alloy channel region 230 can each be doped with a relatively high concentration of a P-type dopant so as to have P+ conductivity. In this case, the center portion 231 of the silicon alloy channel region 230 either can have N-type conductivity (i.e., the center portion 231 of the silicon alloy channel region 230 can be doped with an N-type dopant) or can have P-type conductivity at a lesser conductivity level (i.e., the center portion 231 of the silicon alloy channel region 230 can be doped with a relatively low concentration of a P-type dopant so as to have P− conductivity). However, if the MOSFET 200 comprises an N-type MOSFET, then the silicon source/drain regions 220 and the edge portions 232 of the silicon alloy channel region 230 can each have N-type conductivity. Specifically, the silicon source/drain regions 220 and edge portions 232 of the silicon alloy channel region 230 can each be doped with a relatively high concentration of an N-type dopant so as to have N+ conductivity. In this case, the center portion 231 of the silicon alloy channel region 230 either can have P-type conductivity (i.e., the center portion 231 of the silicon alloy channel region 230 can be doped with a P-type dopant) or can have N-type conductivity at a lesser conductivity level (i.e., the center portion 231 of the silicon alloy channel region 230 can be doped with a relatively low concentration of an N-type dopant so as to have N− conductivity).

FIG. 3A is cross-section illustration of a non-planar, multi-gate MOSFET structure 300 and, particularly, a multi-fin, multi-gate (i.e., dual-gate or tri-gate) MOSFET through a horizontal plane. FIG. 3B is a cross-section illustration of the same MOSFET structure 300 through a vertical plane A-A', as shown in FIG. 3A.

Referring to FIGS. 3A-3B, the MOSFET 300 can be configured in essentially the same manner as the single-fin, multi-gate, MOSFET 200 described above and illustrated in FIGS. 2A-2C, but can incorporate multiple semiconductor bodies 310a, 310b on the insulator layer 302 and, particularly, multiple semiconductor fins. Each semiconductor body 310a, 310b (i.e., each semiconductor fin) can comprise silicon source/drain regions 320a, 320b (e.g., epitaxial silicon source/drain regions) and an exclusively silicon alloy channel region 330a, 330b positioned laterally between the silicon source/drain regions 320a, 320b, respectively. For purposes of this disclosure, the phrase "exclusively silicon alloy channel regions" refers to the fact that the channel regions 330a, 330b of each semiconductor body 310a, 310b are not formed from a combination of silicon and silicon alloy layers, as in prior art hetero-structures. In this embodiment, the gate structure 380 and gate sidewall spacers 390 can traverse the semiconductor bodies 310a, 310b at their respective silicon alloy channel regions 330a, 330b. Optionally, for a dual-gate MOSFET, a dielectric cap can electrically isolate the top surfaces of the silicon alloy channel regions 330a, 330b from the gate structure 380. As in the previously described embodiments, the silicon alloy material used for the silicon alloy channel regions 330a, 330b will vary depending upon whether the MOSFET 300 is a P-type MOSFET or an N-type MOSFET in order to achieve optimal charge carrier mobility and band energy with low source/drain dopant diffusivity. Furthermore, for enhanced source/drain junction profiles and, thereby limited short-channel effects, the edge portions 332a, 332b of each silicon alloy channel region 330a, 330b and the center portion 331a, 331b of each silicon alloy channel region 330a, 330b, respectively, can have different types of conductivity and/or different levels of conductivity.

FIG. 4A is cross-section illustration of another non-planar, multi-gate (i.e., dual-gate or tri-gate) MOSFET structure 400 through a horizontal plane. FIG. 4B is a cross-section illustration of the same MOSFET structure 400 through a vertical plane A-A', as shown in FIG. 4A.

Referring to FIGS. 4A-4B, the MOSFET 400 can comprise a single semiconductor body 410 on the insulator layer 402; however, this single semiconductor body 410 can comprise a single silicon source region 420.1, a single silicon drain region 420.2 parallel to the single source region 420.1 and a plurality of fin-shaped exclusively silicon alloy channel regions 430a, 430b that extend from the source region 420.1 to the drain region 420.2. The silicon source/drain regions 420.1, 420.2 can comprise merged epitaxial silicon deposited onto exposed surfaces of the silicon alloy channel regions 430a, 430b at interfaces 434a and 434b, during processing (see detailed discussion below with regard to the method embodiments). For purposes of this disclosure, the phrase an "exclusively silicon alloy channel regions" refers to the fact that the channel regions 430a, 430b are not formed from a combination of silicon and silicon alloy layers, as in prior art hetero-structures. In this embodiment, the gate structure 480 and gate sidewall spacers 490 can traverse the semiconductor body 410 at the silicon alloy channel regions 430a, 430b. Optionally, for a dual-gate MOSFET, a dielectric cap can electrically isolate the top surfaces of the silicon alloy channel regions 430a, 430b from the gate structure 480. As in the previously described embodiments, the silicon alloy material used for the silicon alloy channel regions 430a, 430b will vary depending upon whether the MOSFET 400 is a P-type MOSFET or an N-type MOSFET in order to achieve optimal charge carrier mobility and band energy with low source/drain dopant diffusivity. Furthermore, for enhanced source/drain junction profiles and, thereby limited short-channel effects, the edge portions 432a, 432b of each silicon alloy channel region 330a, 430b and the center portion 431a, 331b of each silicon alloy channel region 430a, 330b, respectively, can have different types of conductivity and/or different levels of conductivity.

It should be noted that the MOSFET structures 100, 200, 300 and 400, described above and illustrated in FIGS. 1, 2A-2C, 3A-3B and 4A-4B, respectively, can each further comprise various additional features typically found on planar and non-planar MOSFET structures (e.g., metal silicide layers, interlayer dielectrics, contacts, etc.). Also disclosed herein are method embodiments for forming the above-described MOSFET structures.

Figure 5:
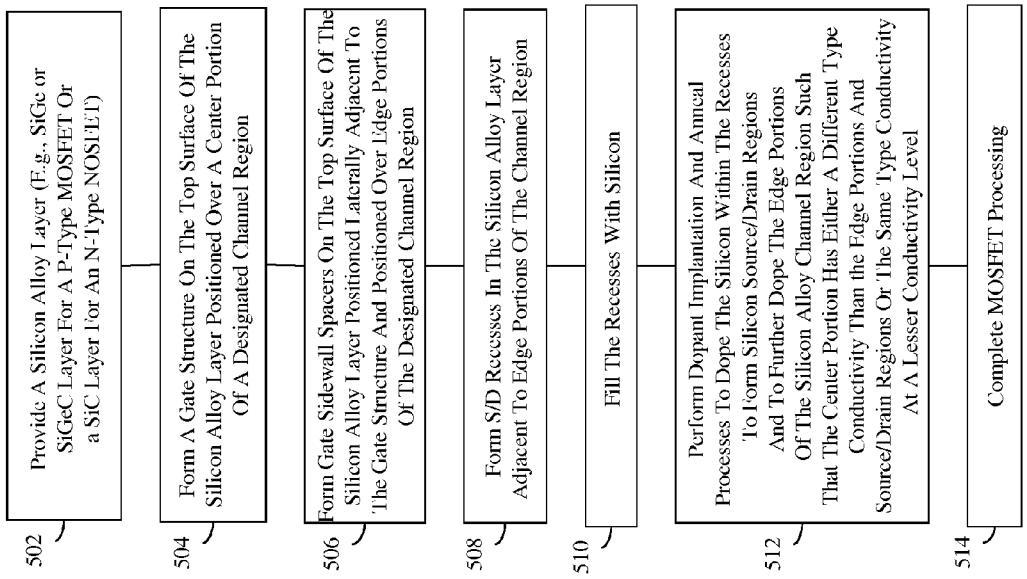
FIG. 5 is a flow diagram illustrating an embodiment of a method for forming a planar field effect transistor.
Figure 6:
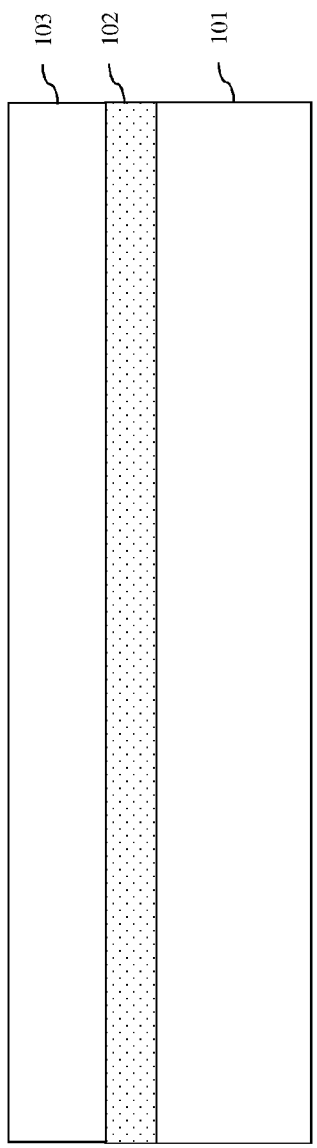
FIG. 6 is a cross-section illustration of a partially completed planar field effect transistor formed according to the method of FIG. 5.

Referring to FIG. 5, an embodiment of a method for forming a planar MOSFET, such as the MOSFET 100 described above and illustrated in FIG. 1, can comprise providing a silicon alloy layer 103 (502, see FIG. 6). For example, a semiconductor-on-insulator wafer can be provided that comprises a substrate 101 (e.g., a silicon substrate or any other suitable substrate); an insulator layer 102 (e.g., a silicon dioxide (SiO2) layer, a sapphire layer or any other suitable insulator layer) on the substrate 101; and a silicon alloy layer 103 on the insulator layer 102. The silicon alloy material of this silicon alloy layer 103 can be pre-selected for optimal charge carrier mobility and band energy and for having low source/drain dopant diffusivity, depending upon whether the MOSFET being formed is a P-type MOSFET or N-type MOSFET. For example, if the MOSFET 100 is to be a P-type MOSFET, then the silicon alloy can comprise, for example, a silicon germanium layer or a silicon germanium carbide layer, which have low diffusivity to P-type dopants and which can provide for optimal hole mobility and valence band energy. Contrarily, if the MOSFET 100 comprises an N-type MOSFET, then the silicon alloy can comprise silicon carbide, which has low diffusivity for N-type dopants and which can provide for optimal electron mobility and conduction band energy. The silicon alloy layer 103 can be relatively thin (e.g., between 5 and 500 nm and, preferably, between 10 and 100 nm) such that in the resulting structure, as shown in FIG. 1, the silicon alloy channel region 130 is relatively thin.

Figure 7:
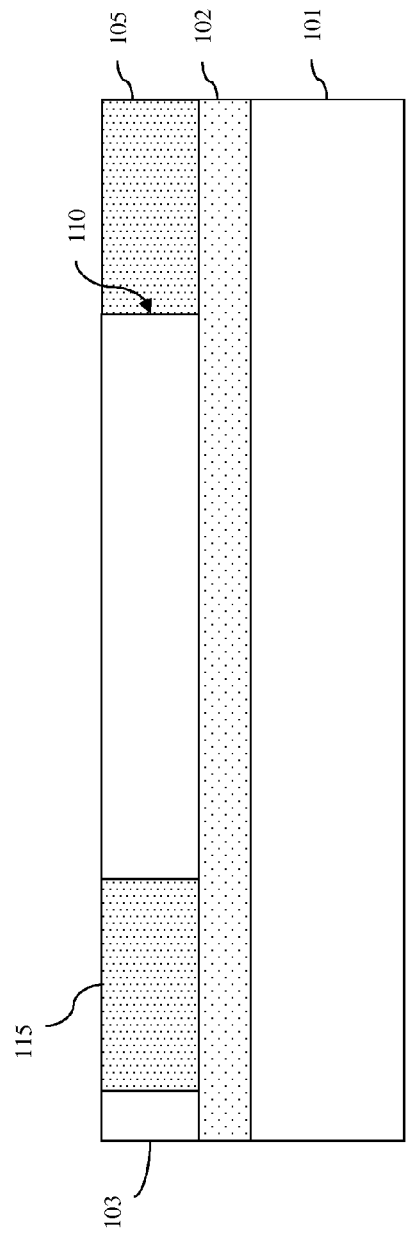
FIG. 7 is a cross-section illustration of a partially completed planar field effect transistor formed according to the method of FIG. 5.

A trench isolation region 105 can be formed in the silicon alloy layer 103 so as to define the active region of the MOSFET 100 (i.e., to define the size and shape of the semiconductor body 110 to be used for the MOSFET 100) (see FIG. 7). For example, a conventional shallow trench isolation (STI) region can be formed by patterning (e.g., lithographically) and etching a relatively shallow trench into the silicon alloy layer 103 such that the trench extends vertically through the silicon alloy layer 103 to the insulator layer 102 and such that the trench laterally surrounds a semiconductor body having the desired size and shape. The trench can subsequently be filled with one or more isolation materials (e.g., silicon oxide, silicon nitride, silicon oxynitride, etc.). Techniques for forming shallow trench isolation regions to define the active region for a semiconductor device are well known in the art and, thus, the details are omitted from this specification in order to allow the reader to focus on the salient aspects of the disclosed embodiments.

Figure 8:
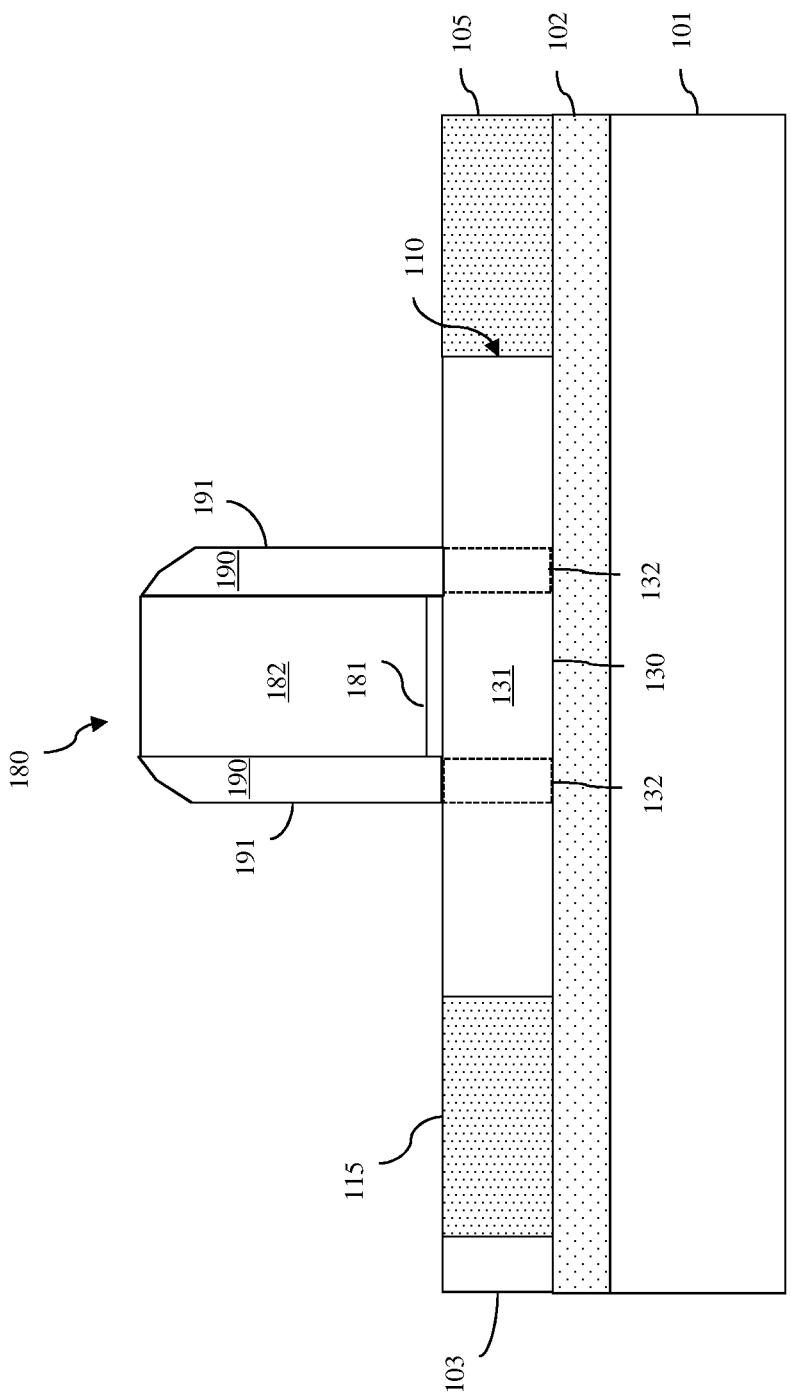
FIG. 8 is a cross-section illustration of a partially completed planar field effect transistor formed according to the method of FIG. 5.

Then, a gate structure 180 can be formed on the top surface of the silicon alloy layer 103 positioned over a center portion 131 of a designated channel region 130 (504, see FIG. 8). For example, a gate dielectric layer 181 (e.g., a gate oxide layer, a high-k gate dielectric layer or other suitable gate dielectric layer) can be formed (e.g., deposited) on the silicon alloy layer 103 and a gate conductor layer 182 (e.g., a polysilicon gate conductor layer, a metal gate conductor layer, a dual work function gate conductor layer or other suitable gate conductor layer) can be formed (e.g., deposited) on the gate dielectric layer 181. The resulting gate dielectric layer-gate conductor layer stack can then be patterned (e.g., lithographically) and etched to form the gate structure 180 above the center portion 131 only of the channel region 130. Techniques for forming gate structures, having comprising different materials and/or configurations, on a planar MOSFET are well known in the art and, thus, the details are omitted from this specification in order to allow the reader to focus on the salient aspects of the disclosed embodiments.

Next, dielectric gate sidewall spacers 190 can be formed on the top surface of the silicon alloy layer 103 positioned laterally adjacent to the gate structure 180 and further positioned over the edge portions 132 of the designated channel region 130 (506, see FIG. 8). Specifically, dielectric gate sidewall spacers 190 (e.g., silicon nitride spacers, silicon oxide spacers, silicon oxynitride spacers or any other suitable single or multi-layered dielectric gate sidewall spacers) can be formed on the sidewalls of the gate structure 180. Such gate sidewalls spacers 190 can be formed using conventional sidewall spacer formation techniques. For example, a conformal dielectric layer (e.g., a conformal silicon nitride layer, silicon oxide layer, silicon oxynitride layer, etc.) can be deposited and then directionally etched to form the dielectric gate sidewall spacers 190. Gate sidewall spacer formation techniques are well known in the art and, thus, the details are omitted from this specification in order to allow the reader to focus on the salient aspects of the disclosed embodiments.

Figure 9:
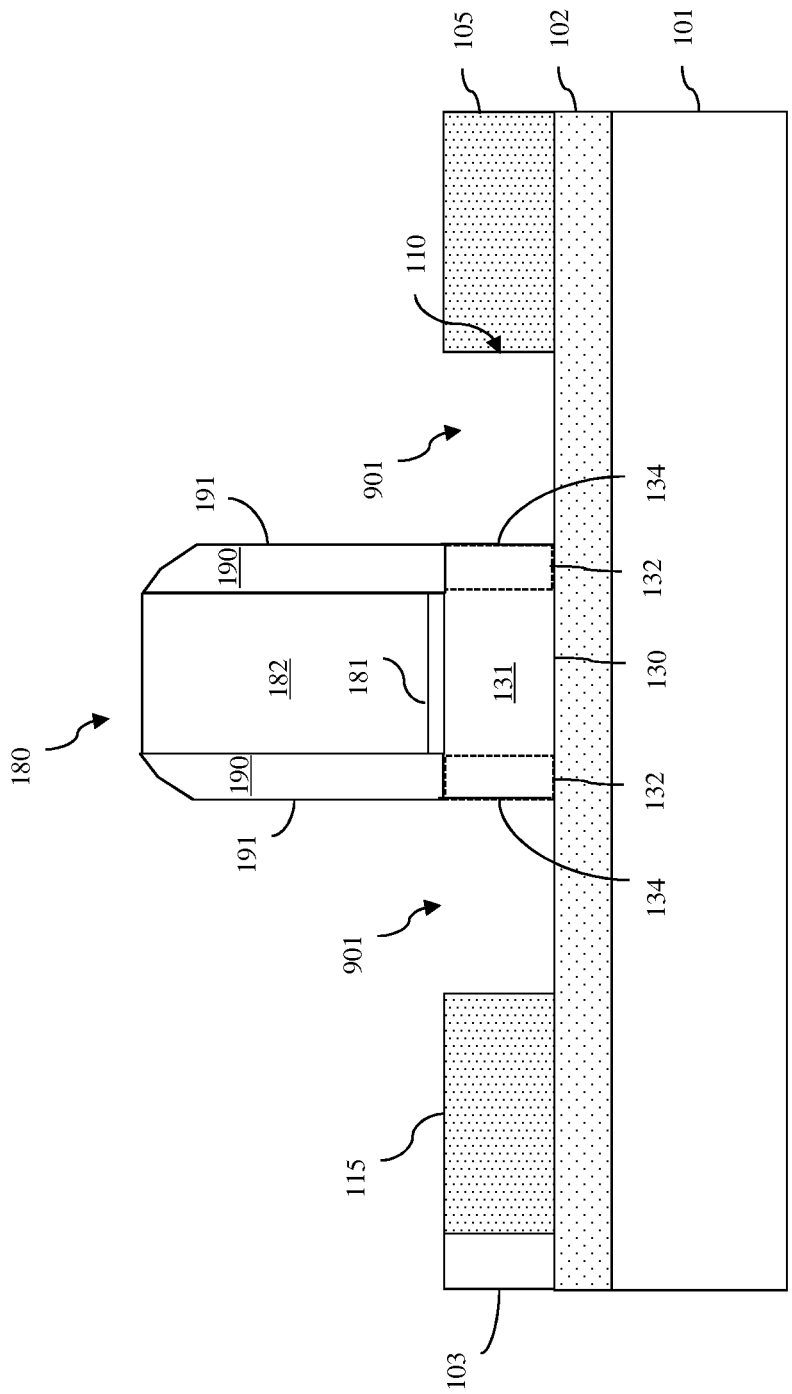
FIG. 9 is a cross-section illustration of a partially completed planar field effect transistor formed according to the method of FIG. 5.

After the gate structure 180 and gate sidewall spacers 190 are formed, recesses 901 can be formed in the silicon alloy layer 103 adjacent to the edge portions 132 of the channel region 130 (508, see FIG. 9). Specifically, these recesses 901 can be formed in the portion of the silicon alloy layer 103 not covered by the gate structure 180 and gate sidewall spacers 190 (i.e., in the portion of the silicon alloy layer 103 between isolation region 105 and the gate sidewall spacers 190). To form the recesses 901, an anisotropic etch process (i.e., a direction etch process) can be used to ensure that the recesses 901 are rectangular in shape with essentially vertical sidewalls and, thereby to ensure that the source/drain to channel region interfaces 134 are essentially vertical, as shown (i.e., essentially perpendicular to the top surface of the insulator layer 102). Alternatively, different types of etch processes can be performed (e.g., as illustrated in U.S. Pat. No. 7,964,910 of Dyer, issued on Jun. 21, 2011, assigned to International Business Machines, Inc. and incorporated herein by reference) to ensure that the recesses 901 have one or more angled sidewalls, for example, such that the source/drain to channel region interfaces 134 are angled (i.e., not perpendicular relative to the top surface of the insulator layer 102).

Figure 10:
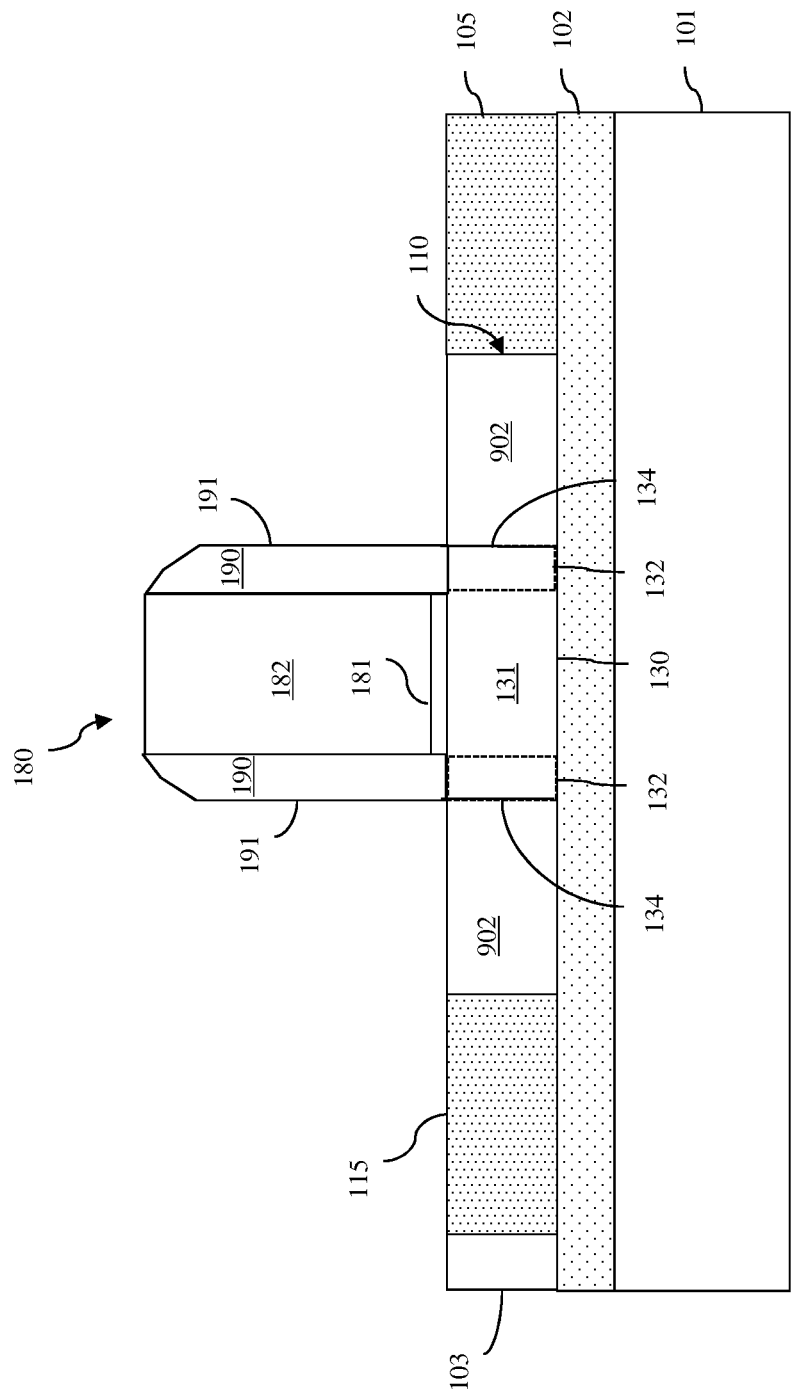
FIG. 10 is a cross-section illustration of a partially completed planar field effect transistor formed according to the method of FIG. 5.

Once the recesses 901 are formed at process 508, the recesses 901 can be filled (e.g., by epitaxial deposition) with silicon 902 (510, see FIG. 10). It should be noted that a lateral epitaxial silicon deposition process can be used to fill the recesses 901 with silicon 902 grown from exposed vertical (or angled, if applicable) surfaces 134 of the channel region 130. However, optionally, etching at process 508 can be stopped prior to exposure of the insulator layer 102, thereby leaving at the bottom of the recesses 901 silicon alloy material from which silicon can be epitaxially grown. Finally, it should be noted that, while the top surfaces of the silicon source/drain regions 120 and the channel region 130 are illustrated in FIG. 10 as being coplanar, it is anticipated that, due to the epitaxial process used to fill the recesses, these top surfaces can alternatively be non-coplanar. That is, the top surfaces of one or both of the silicon source/drain regions can be above or below the top surface of the channel region 130.

Figure 11:
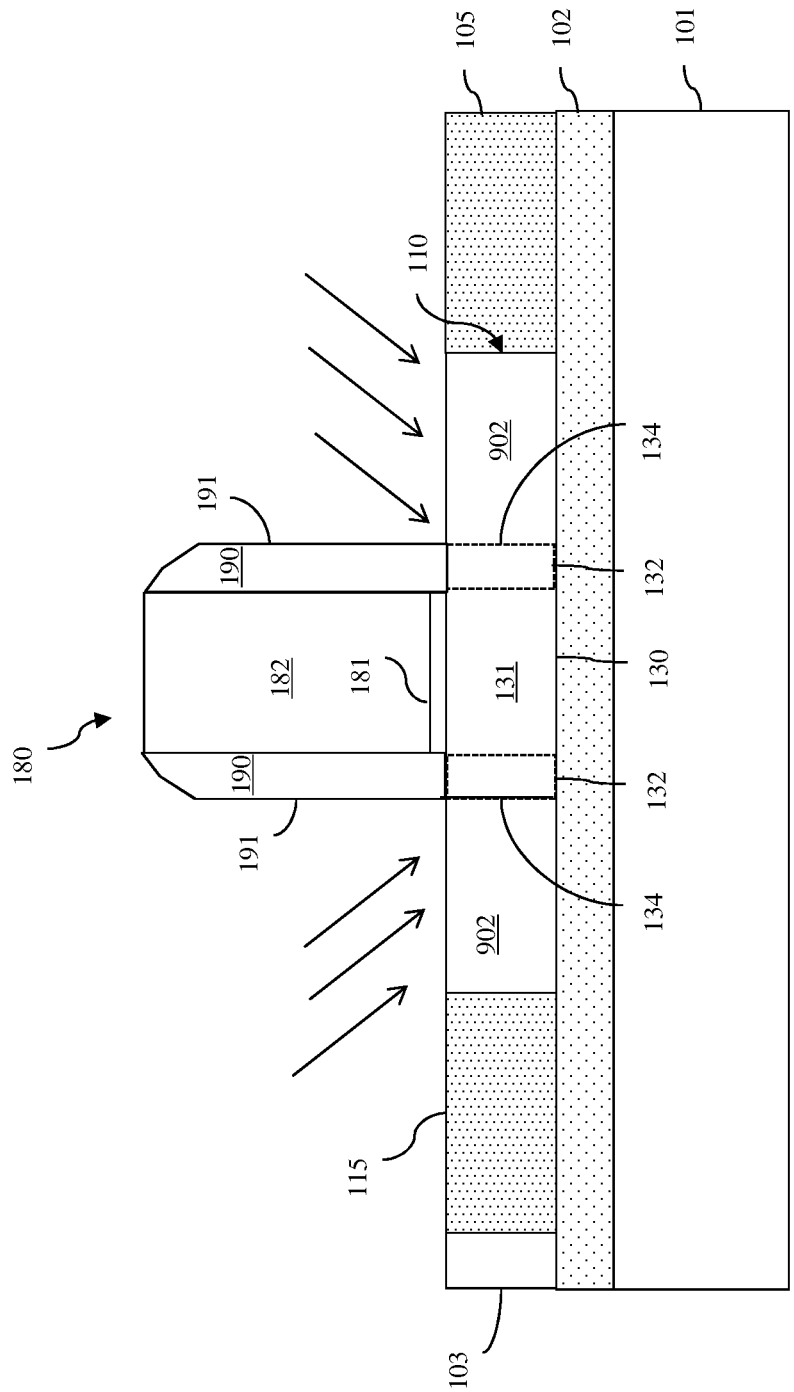
FIG. 11 is a cross-section illustration of a partially completed planar field effect transistor formed according to the method of FIG. 5.

Next, the silicon 902 in the recesses 901 along with the edge portions 132 of the channel region 130, which as discussed above is made exclusively of the silicon alloy, can be doped with a source/drain dopant (e.g., using a dopant implantation process followed by an anneal process) (512, see FIG. 11). Specifically, the dopant implantation and thermal anneal processes can be performed so as to form the silicon source/drain regions 120 (as shown in FIG. 1) and further to ensure that the edge portions 132 of the channel region 130 and the center portion 131 of the channel region 130 have either different types of conductivity and/or different levels of conductivity in order to enhance the source/drain junction profiles and, thereby limit short-channel effects. That is, the silicon source/drain regions 120 and the edge portions 132 of the (exclusively silicon alloy) channel region 130 can be doped at process 512 with the same source/drain dopant 140 such that the center portion 131 of the silicon alloy channel region 130 is left with either a different type conductivity than the edge portions 132 of the silicon alloy channel region 130 and the silicon source/drain regions 120 or the same type conductivity as both the silicon source/drain regions 120 and the edge portions 132 of the silicon alloy channel region 130, but at a lesser conductivity level.

For example, if the MOSFET 100 being formed is a P-type MOSFET, then the silicon source/drain regions 120 and the edge portions 132 of the silicon alloy channel region 130 can each be doped at process 512 so as to have P-type conductivity. That is, the silicon source/drain regions 120 and edge portions 132 of the silicon alloy channel region 130 can each be doped at process 512 with a relatively high concentration of a P-type dopant so as to have P+ conductivity. In this case, the initial silicon alloy layer provided at process 502 and, thereby the resulting center portion 131 of the silicon alloy channel region 130 either can have N-type conductivity (i.e., can be previously doped with an N-type dopant) or can have P-type conductivity at a lesser conductivity level (i.e., can be previously doped with a relatively low concentration of a P-type dopant so as to have P− conductivity). However, if the MOSFET 100 being formed is an N-type MOSFET, then the silicon source/drain regions 120 and the edge portions 132 of the silicon alloy channel region 130 can each be doped at process 512 so as to have N-type conductivity. Specifically, the silicon source/drain regions 120 and edge portions 132 of the silicon alloy channel region 130 can each be doped at process 512 with a relatively high concentration of an N-type dopant so as to have N+ conductivity. In this case, the initial silicon alloy layer provided at process 502 and, thereby the resulting center portion 131 of the silicon alloy channel region 130 either can have P-type conductivity (i.e., can be previously doped with a P-type dopant) or can have N-type conductivity at a lesser conductivity level (i.e., can be previously doped with a relatively low concentration of an N-type dopant so as to have N− conductivity).

It should be noted that, as a result of the relatively high diffusivity of the silicon material to the source/drain dopant and the relatively low diffusivity of the silicon alloy material to the source/drain dopant, diffusion of this dopant deep into the channel region 130 (i.e., past the edge portions 132 and into the center portion 131 of the channel region 130) at process 512 is limited. More specifically, due to the low diffusivity of the silicon alloy, during the implantation process, the diffusion of the majority of source/drain dopant atoms will stop abruptly at the interface 134 between the silicon and silicon alloy material and, during the subsequent anneal process, further diffusion of the dopant atoms past the edge portions 132 of the channel region 130 will be limited. By doping the edge portions 132 of the silicon alloy channel region 130 in the same process step as that used to dope the silicon source/drain regions 120 and taking advantage of the low diffusivity of the silicon alloy channel region 130, the method avoids the need for discrete channel doping steps designed to avoid short-channel effects.

After doping, additional processing can be performed to complete the MOSFET structure 100 (514). Such processing can include, but is not limited to, conventional processing steps for forming metal silicide layers, interlayer dielectrics, contacts, etc.

Figure 12:
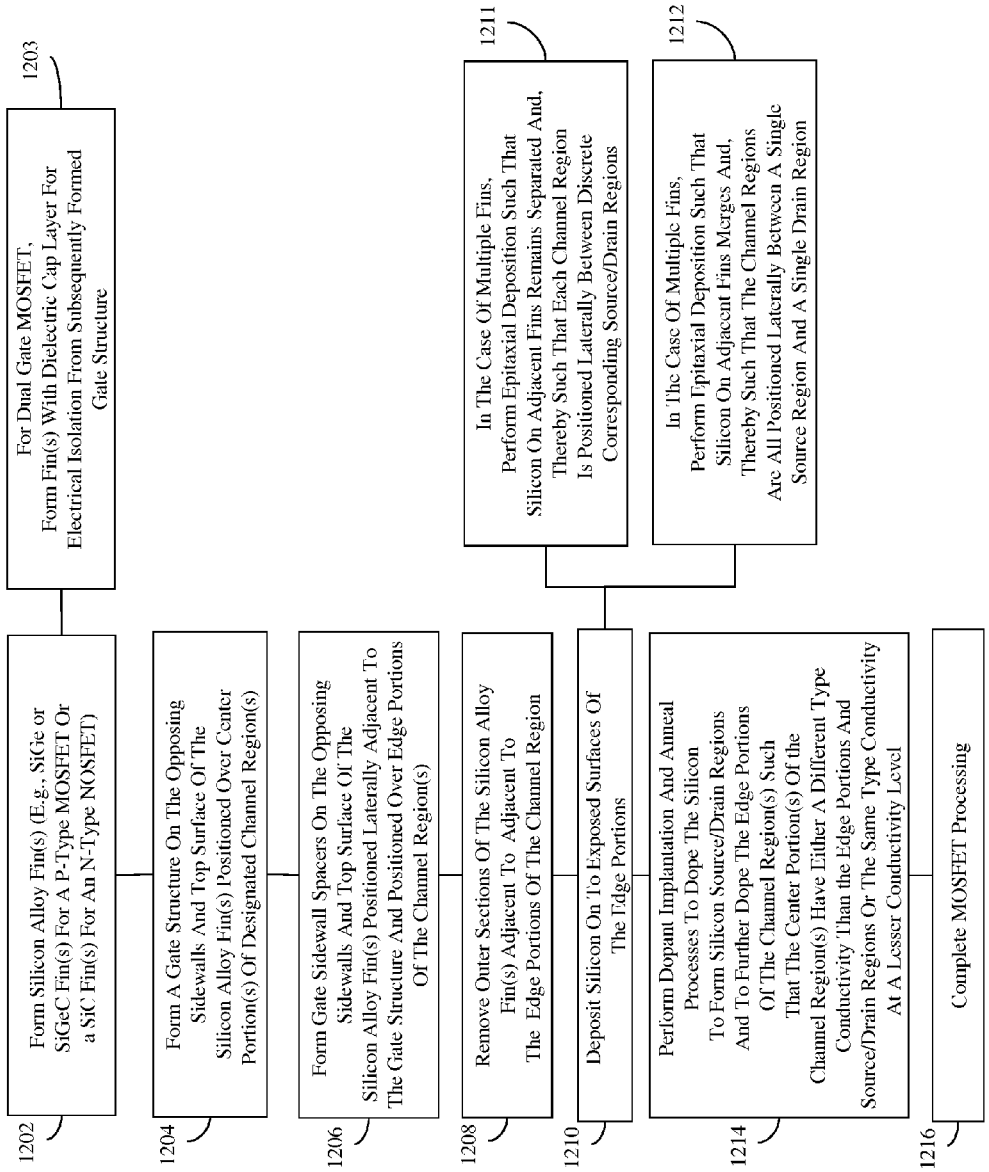
FIG. 12 is a flow diagram illustrating an embodiment of a method of forming a single-fin non-planar field effect transistor.
Figure 13:
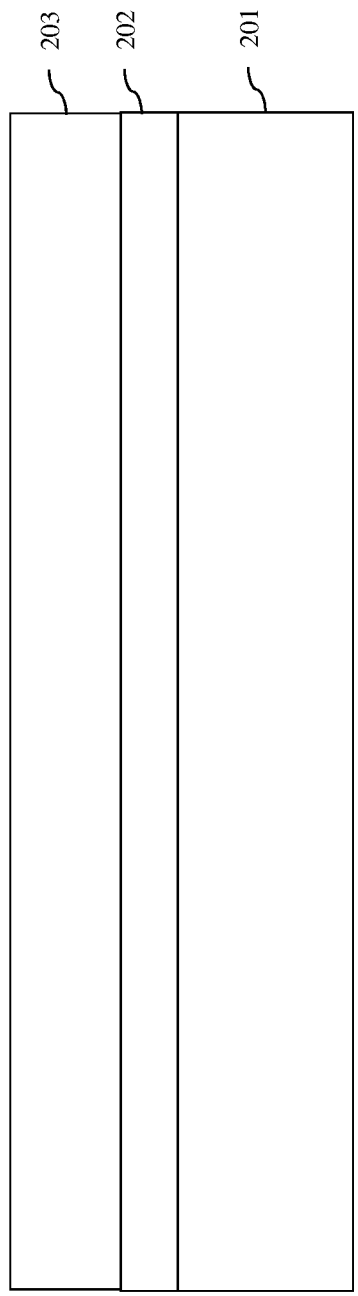
FIG. 13 is a cross-section illustration of a partially completed single-fin non-planar field effect transistor formed according to the method of FIG. 12.

Referring to FIG. 12, an embodiment of a method of forming a single-fin non-planar MOSFET 200, as described in detail above and illustrated in FIGS. 2A-2C, can comprise forming a silicon alloy fin with a designated channel region 230 (1202). For example, as shown in FIG. 13, a semiconductor-on-insulator wafer can be provided that comprises a substrate 201 (e.g., a silicon substrate or any other suitable substrate); an insulator layer 202 (e.g., a silicon dioxide (SiO2) layer, a sapphire layer or any other suitable insulator layer) on the substrate 201; and a silicon alloy layer 203 on the insulator layer 202. The silicon alloy material of this silicon alloy layer 203 can be pre-selected for carrier mobility and band energy, depending upon whether a P-type MOSFET or an N-type MOSFET is being formed. For example, if the MOSFET 200 is to be a P-type MOSFET, then the silicon alloy can comprise, for example, a silicon germanium layer or a silicon germanium carbide layer, which have low diffusivity to P-type dopants and which can provide for optimal hole mobility and valence band energy. Contrarily, if the MOSFET 100 comprises an N-type MOSFET, then the silicon alloy can comprise silicon carbide, which has low diffusivity for N-type dopants and which can provide for optimal electron mobility and conduction band energy. A silicon alloy fin 1410 can be patterned and etched into the silicon alloy layer 203 as shown in the top view diagram of FIG. 14A, the cross-section diagram A-A' of FIG. 14B and the cross-section diagram B-B' of FIG. 14C. Techniques for forming a semiconductor fin from a semiconductor layer are well known in the art (e.g., lithographic patterning and etch techniques, sidewall image transfer techniques, etc.) and, thus, the details are omitted from this specification in order to allow the reader to focus on the salient aspects of the disclosed embodiments.

In any case, the silicon alloy fin 1410 should be formed so that the width is between 5 and 100 nm s. Those skilled in the art will recognize that the desired aspect ratio (i.e., the height to width ratio) of a semiconductor fin and, particularly, the aspect ratio of the designated channel region 230 of a semiconductor fin being formed for a non-planar MOSFET 200 will vary depending upon whether the MOSFET 200 being formed is to be a dual-gate MOSFET or a tri-gate MOSFET. For example, the aspect ratio of the designated channel region 230 of a dual-gate MOSFET can be 1:4 or greater because only two dimensional field effects are relied on to achieve channel region depletion; whereas the aspect ratio of the designated channel region 230 of a tri-gate MOSFET can range between 3:2 and 2:3 because three dimensional field effects are relied on to achieve channel region depletion. Additionally, it be noted that for a dual-gate MOSFET, the silicon alloy fin 1410 should also be formed with a dielectric cap layer 233 so as to provide top surface electrical isolation from a subsequently formed gate structure (1203, see FIG. 14B).

Then, a gate structure 180 can be formed on the opposing sides and the top surface of the silicon alloy fin 1410 positioned over a center portion 131 of the designated channel region 230 (1204, see FIGS. 15A-15C). For example, a gate dielectric layer 281 (e.g., a gate oxide layer, a high-k gate dielectric layer or other suitable gate dielectric layer) can be formed (e.g., deposited) on the opposing sides and top surface of the silicon alloy fin 1410 and a gate conductor layer 282 (e.g., a polysilicon gate conductor layer, a metal gate conductor layer, a dual work function gate conductor layer or other suitable gate conductor layer) can be formed (e.g., deposited) on the gate dielectric layer 281. The resulting gate dielectric layer-gate conductor layer stack can then be patterned (e.g., lithographically) and etched to form the gate structure 280 positioned over the center portion 231 only of the channel region 230. Techniques for forming gate structures, having comprising different materials and/or configurations, on a non-planar MOSFET are well known in the art and, thus, the details are omitted from this specification in order to allow the reader to focus on the salient aspects of the disclosed embodiments.

Figure 16A:
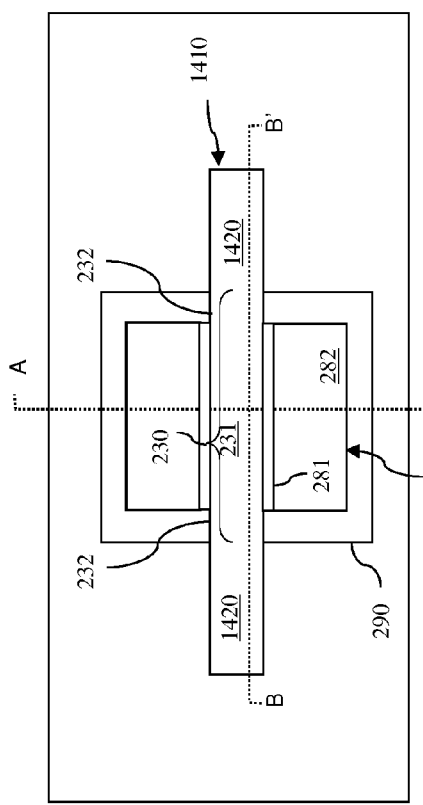
FIG. 16A is a horizontal cross-section illustration of a partially completed single-fin non-planar field effect transistor formed according to the method of FIG. 12.
Figure 16C:
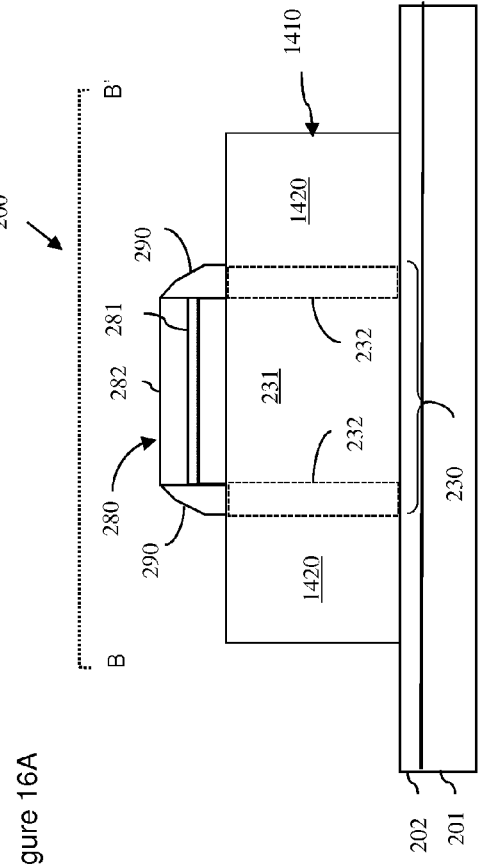
FIG. 16C is a vertical cross-section illustration of the partially completed single-fin non-planar field effect transistor of FIG. 16A along its length through plane B-B'.
Figure 16B:
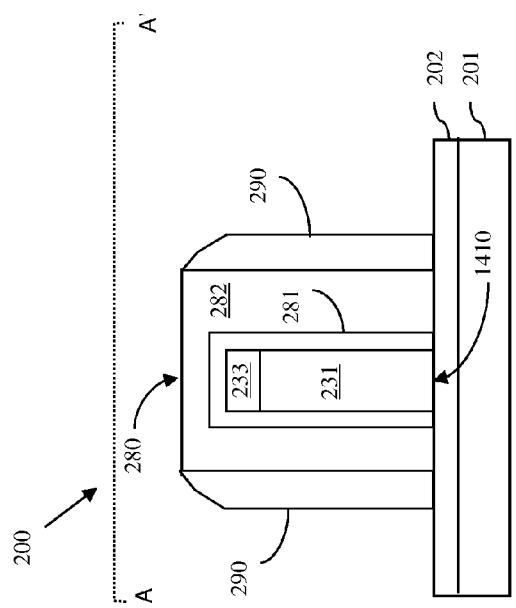
FIG. 16B is a vertical cross-section illustration of the partially completed single-fin non-planar field effect transistor of FIG. 16A along its width through plane A-A'.

Next, dielectric gate sidewall spacers 290 can be formed on the opposing sides and top surface of the silicon alloy fin 1410 positioned laterally adjacent to the gate structure 280 and further positioned over the edge portions 232 of the designated channel region 230 (1206, see FIGS. 16A-16C). Specifically, dielectric gate sidewall spacers 290 (e.g., silicon nitride spacers, silicon oxide spacers, silicon oxynitride spacers or any other suitable single or multi-layered dielectric gate sidewall spacers) can be formed on the sidewalls of the gate structure 280 such that outer sections 1420 of the silicon alloy fin 1410 adjacent to the edge portions 232 of the channel region 230 remain exposed. Such gate sidewalls spacers 290 can be formed using conventional sidewall spacer formation techniques. For example, a conformal dielectric layer (e.g., a conformal silicon nitride layer, silicon oxide layer, silicon oxynitride layer, etc.) can be deposited over the silicon alloy fin 1410 and then directionally etched to form the dielectric gate sidewall spacers 290. Gate sidewall spacer formation techniques are well known in the art and, thus, the details are omitted from this specification in order to allow the reader to focus on the salient aspects of the disclosed embodiments.

After the gate structure 280 and gate sidewall spacers 290 are formed, the exposed outer sections 1420 of the silicon alloy fin 1410 can be removed such that side surfaces 1434 of the edge portions 232 of the channel region 230 are exposed (1208, see FIGS. 17A-17C). To remove the outer sections 1420, an anisotropic etch process (i.e., a direction etch process) can be used to ensure that the side surfaces 1434 of the edge portions 232 of the channel region 230 are essentially vertical, as shown (i.e., essentially perpendicular to the top surface of the insulator layer 202). Alternatively, different types of etch processes can be performed to ensure that these side surfaces 1434 are angled (i.e., not perpendicular relative to the top surface of the insulator layer 202).

Figure 18A:
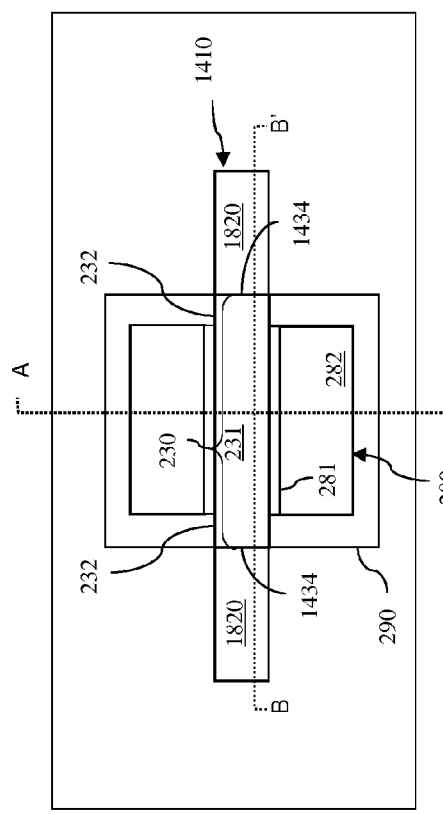
FIG. 18A is a horizontal cross-section illustration of a partially completed single-fin non-planar field effect transistor formed according to the method of FIG. 12.
Figure 18C:
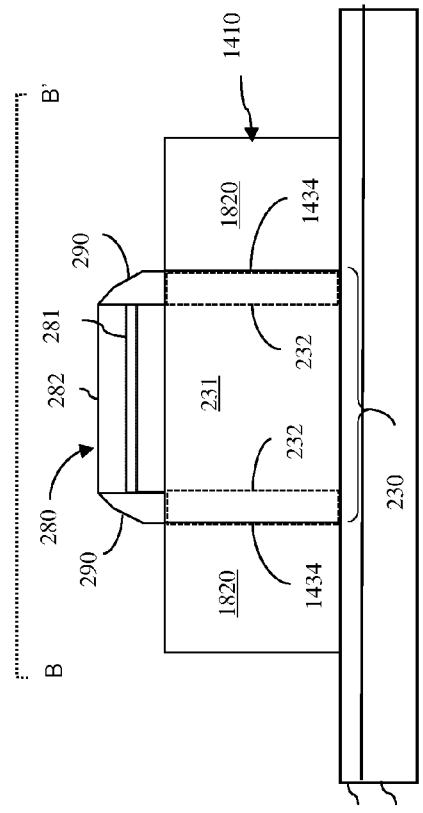
FIG. 18C is a vertical cross-section illustration of the partially completed single-fin non-planar field effect transistor of FIG. 18A along its length through plane B-B'.
Figure 18B:
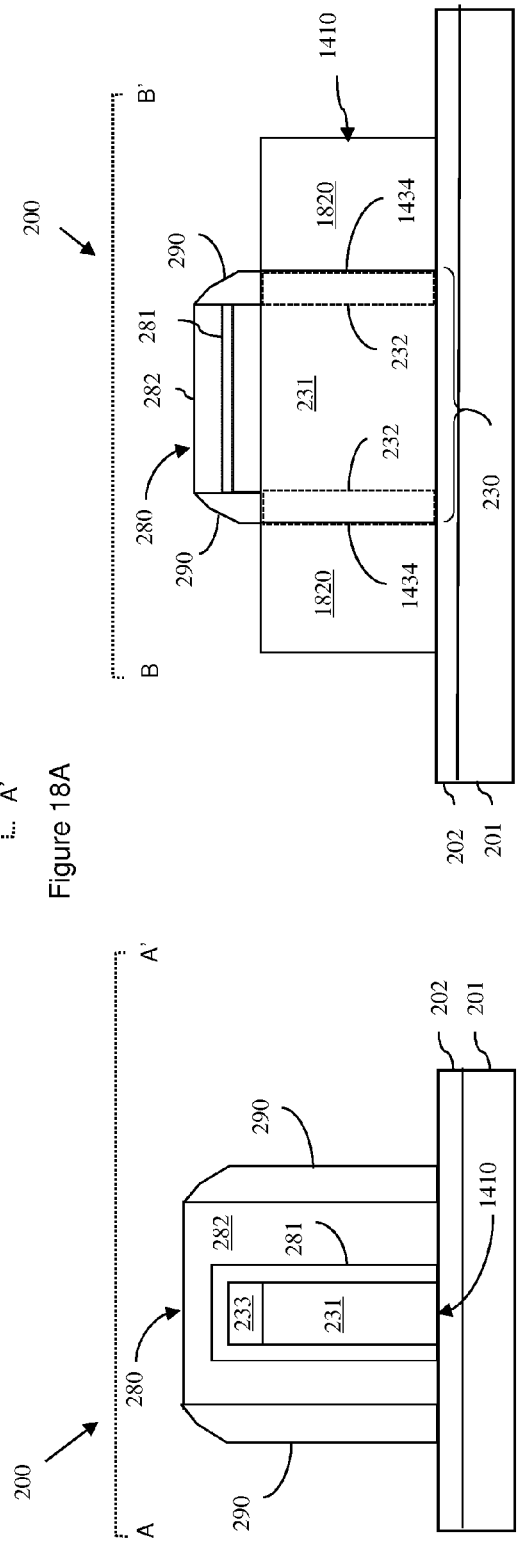
FIG. 18B is a vertical cross-section illustration of the partially completed single-fin non-planar field effect transistor of FIG. 18A along its width through plane A-A'.

Then, silicon 1820 can be deposited (e.g., by lateral epitaxial deposition) on the exposed side surfaces 1434 (1210, see FIGS. 18A-18C). Next, the silicon 1820 along with the edge portions 232 of the channel region 230 can be doped with a source/drain dopant (e.g., using a dopant implantation process followed by an anneal process) (1214). Specifically, the dopant implantation and thermal anneal processes can be performed so as to form the silicon source/drain regions 220 (as shown in FIGS. 2A and 2C) and further to ensure that the edge portions 232 of the channel region 230 and the center portion 231 of the channel region 230 have either different types of conductivity and/or different levels of conductivity in order to enhance the source/drain junction profiles and, thereby limit short-channel effects. That is, the silicon source/drain regions 220 and the edge portions 232 of the (exclusively silicon alloy) channel region 230 can be doped at process 1214 with the same source/drain dopant 240 such that the center portion 231 of the silicon alloy channel region 230 has a different type conductivity than the edge portions 232 of the silicon alloy channel region 230 and the silicon source/drain regions 220 or has the same type conductivity as both the silicon source/drain regions 220 and the edge portions 232 of the silicon alloy channel region 230, but at a lesser conductivity level.

For example, if the MOSFET 300 being formed is a P-type MOSFET, then the silicon source/drain regions 320 and the edge portions 332 of the silicon alloy channel region 330 can each be doped at process 1214 so as to have P-type conductivity. That is, the silicon source/drain regions 220 and edge portions 232 of the silicon alloy channel region 230 can each be doped at process 1214 with a relatively high concentration of a P-type dopant so as to have P+ conductivity. In this case, the initial silicon alloy fin 1410 formed at process 1202 and, thereby the resulting center portion 231 of the silicon alloy channel region 230 either can have N-type conductivity (i.e., can be previously doped with an N-type dopant) or can have P-type conductivity at a lesser conductivity level (i.e., can be previously doped with a relatively low concentration of a P-type dopant so as to have P− conductivity). However, if the MOSFET 200 being formed is an N-type MOSFET, then the silicon source/drain regions 220 and the edge portions 232 of the silicon alloy channel region 230 can each be doped at process 1214 so as to have N-type conductivity. Specifically, the silicon source/drain regions 220 and edge portions 232 of the silicon alloy channel region 230 can each be doped at process 1214 with a relatively high concentration of an N-type dopant so as to have N+ conductivity. In this case, the initial silicon alloy fin 1410 formed at process 1202 and, thereby the resulting center portion 231 of the silicon alloy channel region 230 either can have P-type conductivity (i.e., can be previously doped with a P-type dopant) or can have N-type conductivity at a lesser conductivity level (i.e., can be previously doped with a relatively low concentration of an N-type dopant so as to have N− conductivity).

It should be noted that, as a result of the relatively high diffusivity of the silicon material to the source/drain dopant and the relatively low diffusivity of the silicon alloy material to the source/drain dopant, diffusion of this dopant deep into the channel region 230 (i.e., past the edge portions 232 and into the center portion 231 of the channel region 230) at process 1214 is limited. More specifically, due to the low diffusivity of the silicon alloy, during the implantation process, the diffusion of the majority of source/drain dopant atoms will stop abruptly at the interfaces 234 between the silicon and silicon alloy material and, during the subsequent anneal process, further diffusion of the dopant atoms past the edge portions 232 of the channel region 230 will be limited. By doping the edge portions 232 of the silicon alloy channel region 230 in the same process step as that used to dope the silicon source/drain regions 220 and taking advantage of the low diffusivity of the silicon alloy channel region 230, the method avoids the need for discrete channel doping steps designed to avoid short-channel effects.

After doping, additional processing can be performed to complete the MOSFET structure 200 (1214). Such processing can include, but is not limited to, conventional processing steps for forming metal silicide layers, interlayer dielectrics, contacts, etc.

It should be noted that embodiments of a method of forming a multi-fin non-planar MOSFET structure, such as the MOSFET structure 300 of FIGS. 3A-3B or the MOSFET structure 400 of FIGS. 4A-4B, can proceed using essentially the same techniques described above for forming a single-fin MOSFET 100 and shown in FIG. 12. Specifically, referring to FIG. 12 in combinations with FIGS. 3A-3B and FIGS. 4A-4B, in this case, multiple silicon alloy fins can be formed at process 1202. Then, at processes 1204 and 1206, the gate structure 380, 480 and gate sidewall spacers 390, 490 can be formed so as to traverse all of the channel regions 330a-b, 430a-b of all of the silicon alloy fins. Next, at process 1208, all outer sections of all silicon alloy fins can be removed and, at process 1210, silicon can be deposited (e.g., by lateral epitaxial deposition) on all exposed side surfaces of all edge portions of all of the channel regions. It should be noted that the deposition process 1210 can be performed so that the silicon on adjacent fins remains separated and, thereby such that in the resulting MOSFET structure 300 of FIGS. 3A-3B each channel region 330a, 330b is positioned laterally between discrete corresponding source/drain regions 320a, 320b (1211). Alternatively, the deposition process 1210 can be performed so that in the resulting MOSFET structure 400 of FIGS. 4A-4B the silicon on adjacent fins merges to form a single source region 420.1 and a single drain region 420.1 with the channel regions 430a, 430b extending from the single source region 420.1 to the single drain region 420.2. Doping can then proceed in the manner described above at process 1214 and additional processing can be performed to complete the MOSFET structure 300, 400 as described above at process 1216.

Those skilled in the art will recognize that in the structure and method embodiments described above different dopants can be used to achieve the different conductivity types. For example, a silicon-based semiconductor material (i.e., silicon or a silicon alloy) having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Those skilled in the art will also recognize that different conductivity levels of the different transistor components will depend upon the relative concentration levels of the dopants.

It should be understood that the terminology used herein is for the purpose of describing particular embodiments only and is not intended to be limiting of the embodiments. As used herein, the singular forms "a", "an" and "the" are intended to include the plural forms as well, unless the context clearly indicates otherwise. It should further be understood that the terms "comprises", "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. In addition, it should be understood that terms such as "right", "left", "vertical", "horizontal", "top", "bottom", "upper", "lower", "under", "below", "underlying", "over", "overlying", "parallel", "perpendicular", etc., used herein are relative locations as they are oriented and illustrated in the drawings (unless otherwise indicated). Furthermore, terms such as "touching", "on", "in direct contact", "abutting", "directly adjacent to", "immediately adjacent to", etc., are intended to mean that at least one element physically contacts another element (without other elements separating the described elements).

It should further be understood that the method embodiments, as described above, shall be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Finally, it should be understood that the corresponding structures, materials, acts, and equivalents of all means or step plus function elements in the claims below are intended to include any structure, material, or act for performing the function in combination with other claimed elements as specifically claimed. The above description of the embodiments is presented for purposes of illustration and is not intended to be exhaustive or limiting. Many modifications and variations to the disclosed embodiments will be apparent to those of ordinary skill in the art without departing from the scope and spirit of the disclosed embodiments.

Therefore, disclosed above are embodiments of a metal oxide semiconductor field effect transistor (MOSFET) structure (e.g., a planar MOSFET or a non-planar MOSFET, such as a single-fin or multi-fin, multi-gate MOSFET) and a method of forming the structure. The MOSFET structure incorporates source/drain regions and a channel region positioned laterally between the source/drain regions. The source/drain regions can be made up of silicon, which has high diffusivity to both P-type and N-type source/drain dopants. The channel region can be made up exclusively of a silicon alloy (e.g., silicon germanium or silicon germanium carbide for a P-type MOSFET or silicon carbide for an N-type MOSFET), which is selected for optimal charge carrier mobility and band energy and for having low source/drain dopant diffusivity. During processing, the source/drain dopant can diffuse into the edge portion of the silicon alloy channel region. However, due to the low diffusivity of the silicon alloy to the source/drain dopant, the dopant does not diffuse deep into channel region. Thus, the edge portions of the silicon alloy channel region can have essentially the same dopant profile as the silicon source/drain regions, but a different dopant profile than the center portion of the silicon alloy channel region.

As a result, the source/drain junction profile of the MOSFET is enhanced and short-channel effects are lowered allowing for device scaling without corresponding performance degradation. Specifically, as MOSFETs are scaled in size, threshold voltage (Vt) mismatch driven by random dopant fluctuation (RDF) increases, making circuits that are critically dependent on such matching (e.g., SRAM cells, DRAM cells, etc.) more difficult to fabricate. The above-described embodiments enable short-channel effects to be controlled without the need for a discrete channel-doping step. More specifically, MOSFETS and, particularly, thin-body MOSFETS typically require explicit channel doping steps to be performed in order to control short-channel effects. Without such explicit channel doping steps dopant out-diffusion from the highly doped silicon source/drain regions into the adjacent channel region becomes a dominant contributor to RDF and can limit further CMOS scaling. The above-described embodiments reduce this contribution by taking advantage of the low diffusivity of the silicon alloy channel region to limit the diffusion of source/drain dopant atoms such that these dopant atoms only diffuse into edge portions of the channel region and are otherwise contained inside the high-diffusivity silicon source/drain regions. Thus, the above-described embodiments allow for superior device scaling, which results in reduced voltage operation, smaller SRAM or DRAM cells, lower costs, and lower power requirements, etc.

What is claimed is:

1. A field effect transistor comprising:
    an insulator layer;
    a semiconductor body having a bottom surface adjacent to said insulator layer and a top surface opposite said bottom surface and comprising:
        silicon source/drain regions; and
        a silicon alloy channel region positioned laterally between said silicon source/drain regions,
            said silicon alloy channel region comprising edge portions adjacent to said silicon source/drain regions and a center portion positioned laterally between and immediately adjacent to said edge portions,
            said edge portions and said center portion each comprising a silicon alloy,
            said edge portions having a same type conductivity and same conductivity level as said silicon source/drain regions from said top surface to said bottom surface, and
            said edge portions and said center portion having any of different types of conductivity and different levels of conductivity;
    a gate structure on said top surface of said semiconductor body adjacent to and aligned above said center portion of said silicon alloy channel region; and
    gate sidewalls spacers positioned laterally immediately adjacent to said gate structure and further being on said top surface of said semiconductor body adjacent to and aligned above said edge portions of said silicon alloy channel region such that outer surfaces of said gate sidewall spacers are aligned with interfaces between said edge portions of said silicon alloy channel region and said silicon source/drain regions.

2. The field effect transistor of claim 1, said edge portions of said silicon alloy channel region having a different type conductivity than said center portion of said silicon alloy channel region.

3. The field effect transistor of claim 1, said edge portions of said silicon alloy channel region, said silicon source/drain regions and said center portion of said silicon alloy channel region all having said same type conductivity and said edge portions further having a higher level conductivity than said center portion of said silicon alloy channel region.

4. The field effect transistor of claim 1, said field effect transistor comprising a P-type field effect transistor, said silicon alloy channel region comprising any one of silicon germanium and silicon germanium carbide, said silicon source/drain regions and said edge portions of said silicon alloy channel region having a P+ conductivity and said center portion of said channel region having any one of a N-type conductivity and P− conductivity.

5. The field effect transistor of claim 1, said field effect transistor comprising an N-type field effect transistor, said silicon alloy channel region comprising silicon carbide, said silicon source/drain regions and said edge portions of said silicon alloy channel region having an N+ conductivity and said center portion of said channel region having any one of a P-type conductivity and an N− conductivity.

6. The field effect transistor of claim 1, said silicon source/drain regions comprising epitaxial silicon layers within recesses adjacent to said edge portions of said silicon alloy channel region.

7. A field effect transistor comprising:
    an insulator layer;
    a semiconductor fin having a bottom surface adjacent to said insulator layer, a top surface opposite said bottom surface, and opposing sidewalls, said semiconductor fin comprising:
        silicon source/drain regions; and
        a silicon alloy channel region positioned laterally between said silicon source/drain regions,
            said silicon alloy channel region comprising edge portions adjacent to said silicon source/drain regions and a center portion positioned laterally between and immediately adjacent to said edge portions,
            said edge portions and said center portion each comprising a silicon alloy,
            said edge portions having a same type conductivity and same conductivity level as said silicon source/drain regions from said top surface to said bottom surface, and
            said edge portions and said center portion having any of different types of conductivity and different levels of conductivity;
    a gate structure on said opposing sidewalls of said semiconductor fin adjacent to and aligned above said center portion of said silicon alloy channel region; and
    gate sidewall spacers positioned laterally immediately adjacent to said gate structure and further on said opposing sidewalls of said semiconductor fin adjacent to and aligned with said edge portions of said silicon alloy channel region such that outer surfaces of said gate sidewall spacers are aligned with interfaces between said edge portions of said silicon alloy channel region and said silicon source/drain regions.

8. The field effect transistor of claim 7, said edge portions of said silicon alloy channel region having a different type conductivity than said center portion of said silicon alloy channel region.

9. The field effect transistor of claim 7, said edge portions of said silicon alloy channel region, said silicon source/drain regions and said center portion of said silicon alloy channel region all having said same type conductivity and said edge portions of said silicon alloy channel region further having a higher level conductivity than said center portion of said silicon alloy channel region.

10. The field effect transistor of claim 7, said field effect transistor comprising a P-type field effect transistor, said silicon alloy channel region comprising any one of silicon germanium and silicon germanium carbide, said silicon source/drain regions and said edge portions of said silicon alloy channel region having a P+ conductivity and said center portion of said channel region having any one of a N-type conductivity and P− conductivity.

11. The field effect transistor of claim 7, said field effect transistor comprising an N-type field effect transistor, said silicon alloy channel region comprising silicon carbide, said silicon source/drain regions and said edge portions of said silicon alloy channel region having an N+ conductivity and said center portion of said channel region having any one of a P-type conductivity and an N− conductivity.

12. The field effect transistor of claim 7, said silicon source/drain regions comprising epitaxial silicon layers laterally deposited on vertical surfaces of said edge portions of said silicon alloy channel region.

13. A method of forming a field effect transistor comprising:
providing a silicon alloy layer having a bottom surface adjacent to an insulator layer and a top surface opposite said bottom surface;
forming a gate structure on said top surface of said silicon alloy layer adjacent to and aligned above a center portion of a channel region within said silicon alloy layer;
forming gate sidewall spacers positioned laterally immediately adjacent to said gate structure and further positioned on said top surface of said silicon alloy layer and aligned above edge portions of said channel region;
forming recesses in said silicon alloy layer adjacent to said edge portions of said channel region and extending vertically to said insulator layer and filling said recesses with silicon such that outer surfaces of said gate sidewall spacers are aligned with interfaces between said edge portions of said channel region and said silicon, said filling of said recesses comprising performing a lateral epitaxial silicon deposition process; and
simultaneously doping said silicon and said edge portions of said channel region with a dopant to form silicon source/drain regions adjacent to said edge portions of said channel region, to ensure that said edge portions of said channel region have a same type conductivity and same conductivity level as said silicon source/drain regions from said top surface to said bottom surface and to ensure that said edge portions of said channel region and said center portion of said channel region have any of different types of conductivity and different levels of conductivity.

14. The method of claim 13, said silicon alloy layer having a first type conductivity and said dopant having a second type conductivity such that, after said doping, said center portion of said channel region has a different type conductivity than said silicon source/drain regions and said edge portions of said channel region.

15. The method of claim 13, said silicon alloy layer having a first type conductivity and said dopant having said first type conductivity such that, after said doping, said silicon source/drain regions, said edge portion of said channel region and said center portion of said channel region all have said same type conductivity and said center portion of said channel region has a lesser level than said silicon source/drain regions and said edge portions of said channel region.

16. The method of claim 13, said field effect transistor comprising a P-type field effect transistor, said silicon alloy layer comprising a layer of any one of silicon germanium and silicon germanium carbide, said silicon source/drain regions and said edge portions of said channel region having a P+ conductivity and said center portion of said channel region having any one of a N-type conductivity and P− conductivity.

17. The method of claim 13, said field effect transistor comprising an N-type field effect transistor, said silicon alloy layer comprising a layer of silicon carbide, said silicon source/drain regions and said edge portions of said channel region having an N+ conductivity and said center portion of said channel region having any one of a P-type conductivity and an N− conductivity.

18. A method of forming a field effect transistor comprising:
forming a silicon alloy fin having a bottom surface adjacent to an insulator layer, a top surface opposite said bottom surface and opposing sidewalls;
forming a gate structure on said opposing sidewalls and said top surface of said silicon alloy fin aligned with a center portion of a channel region within said silicon alloy fin;
forming gate sidewall spacers positioned laterally immediately adjacent to said gate structure and on said opposing sidewalls and said top surface of said silicon alloy fin adjacent to and aligned with edge portions of said channel region within said silicon alloy fin such that outer sections of said silicon alloy fin remain exposed;
removing said outer sections such that said insulator layer and side surfaces of said edge portions of said channel region are exposed and depositing silicon on said side surfaces such that outer surfaces of said gate sidewall spacers are aligned with interfaces between said side surfaces of said edge portions of said channel region and said silicon, said depositing comprising performing a lateral epitaxial silicon deposition process; and
simultaneously doping said silicon and said edge portions of said channel region with a dopant to form silicon source/drain regions adjacent to said edge portions of said channel region, to ensure that said edge portions of said channel region have a same type conductivity and same conductivity level as said silicon source/drain regions from said top surface to said bottom surface, and to ensure that said edge portions of said channel region and said center portion of said channel region have any of different types of conductivity and different levels of conductivity.

19. The method of claim 18, said silicon alloy fin having a first type conductivity and said dopant having a second type conductivity such that, after said doping, said center portion of said channel region has a different type conductivity than said silicon source/drain regions and said edge portions of said channel region.

20. The method of claim 18, said silicon alloy fin having a first type conductivity and said dopant having said first type conductivity such that, after said doping, said center portion of said channel region has a same type conductivity at a lesser level than said silicon source/drain regions and said edge portions of said channel region.

21. The method of claim 18, said field effect transistor comprising a P-type field effect transistor, said silicon alloy fin comprising any one of silicon germanium and silicon germanium carbide, said silicon source/drain regions and said edge portions of said silicon alloy channel region having a P+ conductivity and said center portion of said channel region having any one of a N-type conductivity and P− conductivity.

22. The method of claim 18, said field effect transistor comprising an N-type field effect transistor, said silicon alloy fin comprising silicon carbide, said silicon source/drain regions and said edge portions of said silicon alloy channel region having an N+ conductivity and said center portion of said channel region having any one of a P-type conductivity and an N− conductivity.

23. The method of claim 18, said forming of said silicon alloy fin further comprising forming multiple silicon alloy fins, said gate structure and said gate sidewall spacers being formed so as to traverse all channel regions of all of said silicon alloy fins, said removing being performed so as to remove all outer sections of all of said silicon alloy fins, and said depositing being performed such that said silicon is deposited on all side surfaces of all edge portions of all of said channel regions.

\* \* \* \* \*